(12) United States Patent
Tada et al.

(10) Patent No.: US 7,078,894 B2
(45) Date of Patent: Jul. 18, 2006

(54) POLISHING DEVICE USING EDDY CURRENT SENSOR

(75) Inventors: Mitsuo Tada, Kanagawa (JP); Hironobu Yamasaki, Kanagawa (JP); Yasunari Suto, Kanagawa (JP)

(73) Assignee: Ebara Corporation, Tokyo (JP)

( * ) Notice: Subject to any disclaimer, the term of this patent is extended or adjusted under 35 U.S.C. 154(b) by 248 days.

(21) Appl. No.: 10/639,526

(22) Filed: Aug. 13, 2003

(65) Prior Publication Data

US 2004/0032256 A1 Feb. 19, 2004

Related U.S. Application Data

(62) Division of application No. 09/982,025, filed on Oct. 19, 2001.

(30) Foreign Application Priority Data

| Oct. 20, 2000 | (JP) | ............................. 2000-321555 |
| Nov. 24, 2000 | (JP) | ............................. 2000-358032 |
| Jul. 23, 2001 | (JP) | ............................. 2001-222127 |

(51) Int. Cl.
*G01B 7/06* (2006.01)

(52) U.S. Cl. ...................... 324/230; 324/232; 324/233; 324/234; 451/8

(58) Field of Classification Search ................ 324/230, 324/226, 76.39, 76.47, 76.48, 232–234; 377/106; 438/11, 13, 17, 18; 451/8–10; 427/9, 10

See application file for complete search history.

(56) References Cited

U.S. PATENT DOCUMENTS

| 3,541,351 A | * | 11/1970 | Mansson ........................ 327/4 |
| 3,909,714 A | | 9/1975 | Nakano |
| 5,017,869 A | | 5/1991 | Oliver |
| 5,559,428 A | | 9/1996 | Li et al. |
| 5,644,221 A | | 7/1997 | Li et al. |
| 5,659,492 A | | 8/1997 | Li et al. |
| 5,660,672 A | | 8/1997 | Li et al. |
| 5,663,637 A | | 9/1997 | Li et al. |

(Continued)

FOREIGN PATENT DOCUMENTS

JP 60000369 A 1/1985

(Continued)

OTHER PUBLICATIONS

Horowitz, "The Art of Electronics", 1980, Cambridge University Press, p. 618.

*Primary Examiner*—Jay M. Patidar
(74) *Attorney, Agent, or Firm*—Wenderoth, Lind & Ponack, L.L.P.

(57) ABSTRACT

An eddy current sensor and a method for detecting the thickness of a film formed on a substrate. The eddy current sensor, which is capable of stable operation, is operable to accurately detect a polishing endpoint. The eddy current sensor detects the thickness of a conductive film from a change in an eddy current loss generated in the conductive film. The eddy current sensor comprises a sensor coil for generating an eddy current in the conductive film, and an active element unit connected to the sensor coil for oscillating a variable frequency corresponding to the eddy current loss. The sensor coil and active element unit are integrated to form the eddy current sensor. Alternatively, the eddy current sensor comprises a sensor coil for generating an eddy current in the conductive film, and a detector for detecting a change in the thickness of the conductive film from a change in a resistance component in an impedance formed by the sensor coil and conductive film.

6 Claims, 17 Drawing Sheets

U.S. PATENT DOCUMENTS

| | | |
|---|---|---|
| 5,770,948 A | 6/1998 | Li et al. |
| 6,407,546 B1 * | 6/2002 | Le et al. ..................... 324/230 |
| 6,433,541 B1 | 8/2002 | Lehman et al. |
| 6,558,229 B1 | 5/2003 | Kimura et al. |
| 6,563,308 B1 | 5/2003 | Nagano et al. |
| 6,707,540 B1 * | 3/2004 | Lehman et al. ............... 356/72 |
| 6,762,604 B1 * | 7/2004 | Le ............................. 324/230 |
| 6,764,381 B1 | 7/2004 | Kimura et al. |
| 2002/0055192 A1 | 5/2002 | Redeker et al. |
| 2003/0210041 A1 * | 11/2003 | Le ............................. 324/230 |
| 2005/0067289 A1 * | 3/2005 | Noji et al. ..................... 205/83 |
| 2005/0191858 A1 * | 9/2005 | Fukunaga et al. .......... 438/691 |

FOREIGN PATENT DOCUMENTS

| | | | |
|---|---|---|---|
| JP | 60-131404 | * | 7/1985 |
| SU | 901938 | | 1/1982 |
| WO | WO 01/46684 | | 6/2001 |

* cited by examiner

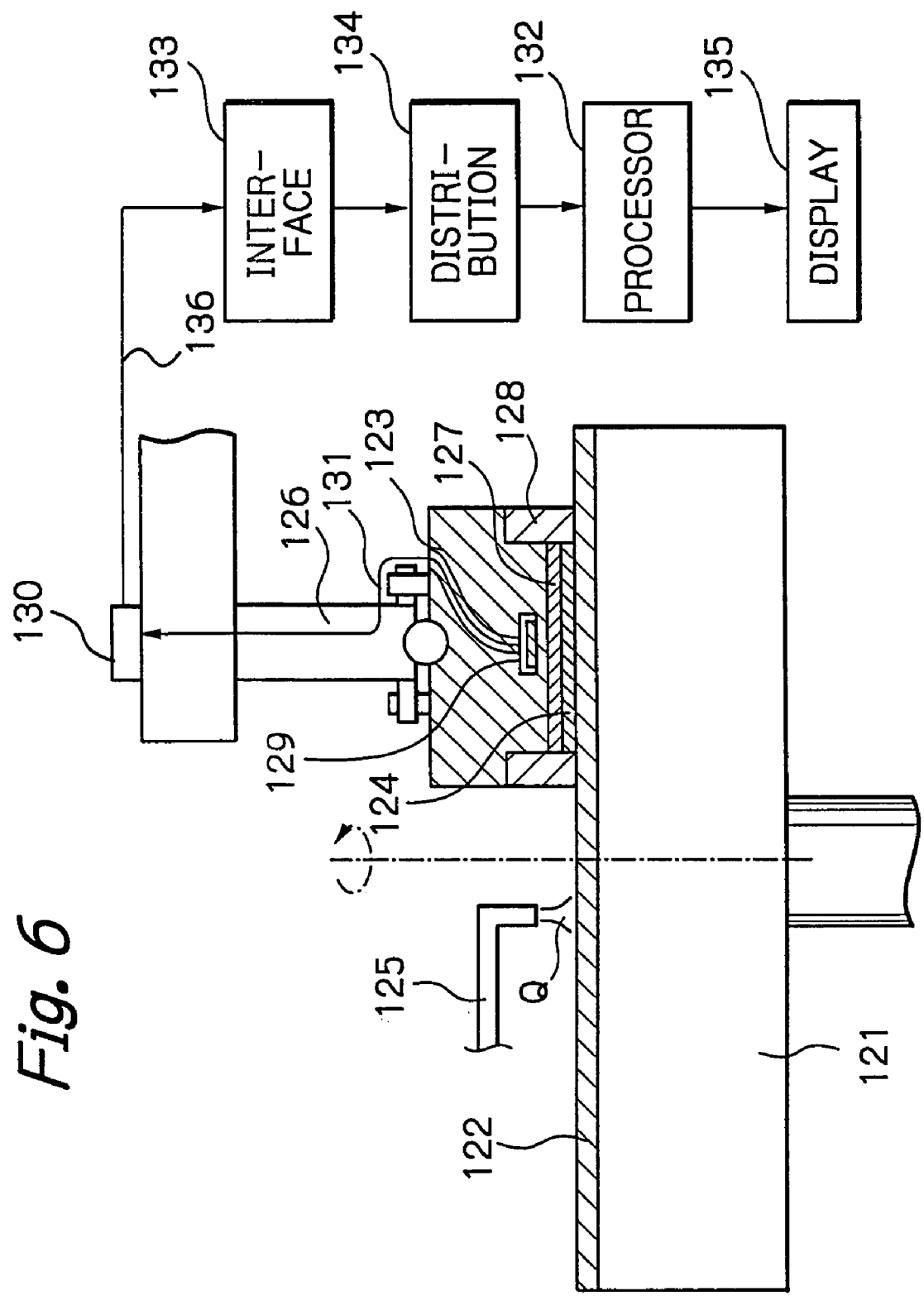

POLISHING DEVICE USING EDDY CURRENT SENSOR

This application is a Divisional application of Ser. No. 09/982,025, filed Oct. 19, 2001, now pending.

BACKGROUND OF THE INVENTION

The present invention relates to a frequency measuring device capable of measuring a frequency highly accurately and continuously within a short period and to a device and method for polishing by using the frequency measuring device.

Further, the present invention relates generally to an eddy current sensor, and more particularly, to an eddy current sensor which is capable of detecting an eddy current loss produced in a conductive film made of copper (Cu) or the like deposited on the surface of a substrate such as a semiconductor wafer, when the conductive film is polished by a chemical mechanical polishing (CMP) technique, to detect the advancement of polishing, and a method of detecting a polished thickness using the eddy current sensor.

A chemical mechanical polishing (CMP) process has been widely employed as a method in which a semiconductor substrate is dipped in a plating solution to conduct, for example, electrolytic plating or non-electrolytic plating to form an electrically conductive film, and thereafter an unnecessary electrically conductive film on the surface of the semiconductor substrate is removed. Hereinafter, with reference to FIGS. 1 to 3, a description will be given of the structure and operation of a polishing device for the CMP process proposed by the applicant of the subject application. FIG. 1 is a longitudinal cross-sectional view showing the entire structure of the polishing device. The polishing device is equipped with a turn table 101, and a top ring 102 that presses a semiconductor wafer 103 against the turn table 101 while retaining the same. The turn table 101 is coupled to a motor 104 so as to be rotatable about a shaft center of the motor 104 as indicated by an arrow. A polishing cloth 105 is attached to the top surface of the turn table 101.

The top ring 102 is coupled to a motor and an elevating cylinder (not shown) through a top ring shaft 106. With this structure, the top ring 102 can be elevated along the top ring shaft 106 in a direction indicated by an arrow and is rotatable about the top ring shaft 106 so that the semiconductor wafer 103 can be pressed against the polishing cloth 105 with an arbitrary pressure. An elastic mat 107 made of polyurethane or the like is disposed on the lower surface of the top ring 102. A guide ring 108 for latching the semiconductor wafer 103 is disposed on the outer peripheral portion of the lower portion of the top ring 102.

A polishing abrasive solution nozzle 109 is located above the turn table 101, and a polishing abrasive solution Q is supplied to the polishing cloth 105 stuck onto the turn table 101 by the polishing abrasive solution nozzle 109.

As shown in FIG. 1, an eddy current sensor 110 that constitutes an end point detecting mechanism for detecting an end point in the polishing of the semiconductor wafer 103 is embedded within the turn table 101. A wiring 111 of the eddy current sensor 110 passes through the turn table 101 and a turn table support shaft 112 and is then connected to a controller 114 through a rotary connector (or slip ring) 113 disposed at a shaft end of the turn table support shaft 112. The controller 114 is connected to a display device (display) 115. Note that, instead of embedding the eddy current sensor 110 within the turn table 101, the eddy current sensor 110 may be embedded within the top ring 102. In the case where the eddy current sensor 110 is embedded within the top ring 102, the connection between the eddy current sensor 110 and the controller 114 is effected through a slip ring (not shown) disposed at an appropriate position of the top ring shaft 106.

FIG. 2 is a plan view showing the positional relationship of the turn table 101, the semiconductor wafer 103 and the eddy current sensor 110 in the polishing device shown in FIG. 1. As shown in the figure, the eddy current sensor 110 is located at a position that passes through a center Cw of the semiconductor wafer 103 that is held by the top ring 102 while being polished. Reference symbol Ct indicates the center of rotation of the turn table 101. The eddy current sensor 110 sequentially detects the thickness of the electrically conductive film such as a Cu layer of the semiconductor wafer 103 on a passing locus during a period where the eddy current sensor 110 passes below the semiconductor wafer 103.

FIGS. 3a and 3b are enlarged main-portion cross-sectional views showing a state where the eddy current sensor 110 is embedded. FIG. 3a shows a case where the polishing cloth 105 is attached to the turn table 101, and FIG. 3b shows a case where a fixed abrasive grain plate 105' is located on the turn table 101. In the case where the polishing cloth 105 is attached to the turn table 101 as shown in FIG. 3a, the eddy current sensor 110 is embedded within the turn table 101. On the other hand, in the case where the fixed abrasive grain plate 105' is located on the turn table 101 as shown in FIG. 3b, the eddy current sensor 1 is embedded within the fixed abrasive grain plate 105'.

In either one of FIGS. 3a and 3b, a distance L from the polishing surface which is the top surface of the polishing cloth 105 or the polishing surface which is the top surface of the fixed abrasive grain plate 105', namely, the surface (lower surface) of the semiconductor wafer 103 to be polished, to the top surface of the eddy current sensor 110 may be set to 1.3 mm or more. In FIGS. 3a and 3b, there is shown the semiconductor wafer 103 where an electrically conductive film 103b consisting of a Cu layer or an Al layer is formed on an oxide film ($SiO_2$) 103a.

The polishing cloth 105 is made of, for example, non-woven fabric such as Politex manufactured by Rodale Corp. or foam polyurethane such as IC 1000. Also, the fixed abrasive grain plate 105' is formed by solidifying fine abrasive grains of several μm or less in the degree of grains (for example, $CeO_2$) using resin as a bonding agent and forming them into a disk shape.

In the polishing device shown in FIGS. 1, 2 and 3a, the semiconductor wafer 103 is held on the lower surface of the top ring 102, and the semiconductor wafer 103 is pressed against the polishing cloth 105, or against the fixed abrasive grain pack 105' of FIG. 3b, on the top surface of the rotating turn table 101 by the elevating cylinder. By supplying the polishing abrasive solution Q from the polishing abrasive solution nozzle 109, the polishing abrasive solution Q is retained on the polishing cloth 105, and polishing is conducted in a state where the polishing abrasive solution Q exists between the surface (lower surface) of the semiconductor wafer 103 to be polished and the polishing cloth 105. The eddy current sensor 110 passes immediately below the surface of the semiconductor wafer 103 to be polished each time the turn table 101 makes one rotation. In this case, because the eddy current sensor 110 is located on the locus that passes through the center Cw of the semiconductor wafer 103, the eddy current sensor 110 can continuously detect the thickness of the electrically conductive film on the arcuate locus of the surface of the semiconductor wafer 103 in accordance with the movement of the eddy current sensor 110. Note that, in order to reduce the detection interval, indicated by the imaginary line of FIG. 2, other eddy current sensors 110' may be added so that two or more eddy current sensors 110' are disposed on the turn table 101.

A brief description will be given here of the principle on which the thickness of the electrically conductive film on the semiconductor wafer 103 formed of a Cu layer or an AL layer is detected by using the eddy current sensor 110 to judge the end point of the CMP process. When a high frequency current flows through the sensor coil of the eddy current sensor 110 to generate an eddy current in the electrically conductive film (metal film) of the semiconductor wafer 103, the eddy current sensor 110 and the semiconductor wafer 103 are magnetically coupled to each other by a mutual inductance. In this state, since the synthetic impedance of the sensor circuit of the eddy current sensor 110 and the conductive film of the semiconductor wafer 103 becomes a function of the resonance frequency of an oscillating circuit within the eddy current sensor 110, the resonance frequency is monitored to thereby make it possible to detect the end point in polishing.

Assume an equivalent circuit of the eddy current sensor 110 and the semiconductor wafer 103, wherein the inductance of the eddy current sensor 110 is L1, the resistance of the eddy current sensor 110 is R1, the inductance of the semiconductor wafer 103 is L2, the resistor of the eddy current sensor 110 is R2, and the mutual inductance that magnetically couples both of the eddy current sensor 110 and the semiconductor wafer 103 is M. Also, assuming that j is the square root of −1 (imaginary number), f is the resonance frequency of the eddy current sensor 110, and $\Omega=2\pi f$, then the above synthetic impedance Z is represented as follows:

$$Z=(R1+Rx \cdot R2)+j\ \Omega)(L1-Rx \cdot L2)$$

$$Rx=\Omega^2 M^2/(R2^2+\Omega^2 L2^2)$$

Therefore, the synthetic impedance Z changes with a change in Rx and the resonance frequency f of the eddy current sensor 110 also changes simultaneously. By monitoring the degree of the change in the resonance frequency f, it is possible to judge the end point of the CMP process.

A detection signal outputted from the eddy current sensor 110 is processed by the controller 114 while the semiconductor wafer 103 is polished by the polishing device shown in FIG. 1 on the basis of the above-mentioned principle, and a change in the resonance frequency f obtained as a result of the above processing is observed. FIG. 4 shows an example of a graph in which an abscissa axis represents a polishing time (sec.), and an ordinate axis represents the resonance frequency f (KHz) of the eddy current sensor 110, respectively. Therefore, the graph of FIG. 4 shows a change in the resonance frequency f when the eddy current sensor 110 passes immediately below the semiconductor wafer 103 a plurality of times. Note that the electrically conductive film on the semiconductor wafer 103 when the above graph is obtained is formed of a Cu layer.

As shown in FIG. 4, as polishing is advanced, that is, as the thickness of the conductive film is reduced, the resonance frequency f obtained as a result of processing the detection signal of the eddy current sensor 110 by the controller 114 continues to reduce (FIG. 4 shows that the resonance frequency f is gradually reduced from 6800 Hz). Therefore, by obtaining in advance the resonance frequency when the conductive film other than the wiring conductors is removed from the semiconductor wafer 103, the resonance frequency f of the eddy current sensor 110 is graphed as shown in FIG. 4, and the end point of the CMP process can be detected from a change in the inclination of the resonance frequency at the respective polishing times. In the graph shown in FIG. 4, the resonance frequency when the unnecessary conductive film is removed from the upper surface of the semiconductor wafer 103 is 6620 Hz.

Also, it is possible to set a certain frequency before the frequency reaches the end point of polishing that is set as a threshold value, and to perform polishing by using the fixed abrasive grain plate 105' (refer to FIG. 3b) with a high polishing speed (polishing rate) until the frequency reaches the threshold value. Polishing is performed by using the polishing cloth 105 (refer to FIG. 3a) with a lower polishing rate than that of the fixed abrasive grain plate 105' after the frequency reaches the threshold value, and the CMP process can be completed when the frequency reaches the frequency at the time the unnecessary conductive film is removed from the upper surface of the semiconductor wafer 103.

In this way, in the CMP process, when the unnecessary electrically conductive film on the semiconductor wafer is removed, if the conductive film is over-polished, a conductor for forming a wiring circuit is also removed, which results in a semiconductor wafer being produced that cannot be used. Also, since an insufficient polishing of the electrically conductive film cannot remove the conductive films that short-circuit between the wiring circuits, it is necessary to further continue polishing, thereby resulting in an increase in the manufacturing cost. Under the above circumstances, there is a required means for detecting the thickness of the electrically conductive film formed on the polished surface of the semiconductor wafer continuously and highly precisely at a real time to accurately determine the end point of polishing.

In order to detect such a change in the resonance frequency, the output of the eddy current sensor is usually applied to a frequency measuring device. FIG. 5a schematically shows the structure of a frequency measuring device FC of a direct counting system conventionally used as an example of the above frequency measuring device, and FIG. 5b shows a signal waveform in FIG. 5a.

In FIG. 5a, a measured signal Vin having a certain frequency is supplied to a signal input terminal IN. The measured signal Vin is a pulse wave obtained by TTL-level converting a sine waveform signal, and has such a shape, for example, as shown by Vin of FIG. 5b. After the measured signal Vin has been amplified by an amplifier A, the measured signal Vin is supplied to one input terminal of a gate circuit G. A time reference signal T outputted from a time reference circuit TR is supplied to the other input terminal of the gate circuit G. As shown in FIG. 5b, the duration of the time reference signal T is t, and the time reference circuit TR supplies the time reference signal T to the gate circuit G at given intervals. As a result, the gate circuit G is opened only during a period of the duration when the time reference signal T is supplied, and the measured signal Vin that has passed through the gate circuit G in a period at which the gate circuit G is opened is applied to a decimal counter DC so as to measure the frequency of the measured signal Vin. The measured result is latched by a latch circuit LC and then supplied to a given processing circuit such as a CPU.

Assuming that the number of pulses of the measured signal Vin that has passed through the gate circuit G in a period of the duration t when the gate circuit G is open is c, the frequency f (Hz) of the measured signal Vin at this time is represented as follows:

$$f = c/t$$

In the case where the frequency measurement having five significant digits is intended to be conducted in a conventional frequency measuring device shown in FIG. 5a, the duration t of the time reference circuit TR can be set to the order of 100 ms, and the time reference circuit TR outputs the time reference signal T whose duration t is, for example, 390 ms at intervals of 390 ms. This means that the measured results of the frequency can be obtained every 390 ms, and therefore the conventional eddy current sensor can detect a change in the thickness of the electrically conductive film on the semiconductor wafer at the intervals of 390 ms.

However, the actual speed of the CMP process is increasing, and in order to accurately detect the end point in polishing and improve the yield, there is a demand for a device and method in which the result of the frequency measurement is supplied at intervals of less than 390 ms to make it possible to more accurately detect the end point in polishing in the present circumstances.

As described above, in order to form a wiring circuit on a semiconductor substrate, a method has been proposed in which grooves for wires of a predetermined pattern are previously formed and the substrate is immersed in a plating solution, for example, for electroless plating or electrolytic plating of copper (Cu), and subsequently unnecessary portions of the plated copper is removed from the surface by a chemical mechanical polishing (CMP) process. Such deposition of a copper layer by plating enables the wiring grooves of a high aspect ratio to be uniformly filled with a highly conductive metal. The CMP process involves pressing a semiconductor wafer held by a top ring onto an abrasive cloth adhered on a turn table, and simultaneously supplying a polishing solution containing abrasive grain to polish a Cu layer on the semiconductor wafer.

When the Cu layer is polished by the CMP process, the Cu layer must be selectively removed from the semiconductor substrate while leaving only portions of the Cu layer which are formed in the grooves for wiring. Specifically, except for the grooves for wiring, the Cu layer must be removed until an oxide film ($SiO_2$) is exposed. In this event, if the Cu layer is excessively polished to remove the Cu layer in the grooves for wiring together with the oxide film ($SiO_2$), a resulting increase in circuit resistance would lead to the abandonment of the entire semiconductor substrate, thereby sustaining a great damage. On the other hand, the Cu layer remaining on the oxide film due to insufficient polishing would fail to fully separate wiring circuits, thereby resulting in short-circuiting. Consequently, the polishing process must be performed again, thereby causing an increase in manufacturing cost. This situation is not limited to the Cu layer but is likewise possible with any other conductive film such as an Al film which is formed and polished by the CMP process.

To address the foregoing problem, a method of detecting a polishing end point using an eddy current sensor has been proposed for detecting an end point for a CMP process. FIG. 6 illustrates a main portion of a conventional polishing apparatus which comprises an eddy current sensor. The illustrated polishing apparatus comprises a rotatable turn table 121 having adhered thereon an abrasive cloth 122 which has a polishing surface on the top of the abrasive cloth 122; a top ring 123 for rotatably holding a semiconductor wafer 124, which is a substrate subjected to polishing, to press the semiconductor wafer 124 onto the abrasive cloth 122; and a polishing solution supply nozzle 125 for supplying the abrasive cloth 122 with a polishing solution Q. In place of the abrasive cloth 122, an abrasive plate formed of a resin having abrasive grains, called "fixed abrasive grains," may be adhered on the turn table 121. The top ring 123 is coupled to a top ring shaft 126 and comprises an elastic mat 127 made of polyurethane or the like applied on its bottom such that the semiconductor wafer 124 is held in contact with the elastic mat 127. The top ring 123 further comprises a cylindrical retainer ring 128 around its outer periphery for preventing the semiconductor wafer 124 from coming off the bottom of the top ring 123 during polishing. The retainer ring 128 is fixed to the top ring 123, with its lower surface formed protrusively from a holding surface of the top ring 123, such that the semiconductor wafer 124 is held in the holding surface and prevented from coming out of the top ring 123 by an abrasive force with the abrasive cloth 122 during the polishing.

The top ring 123 also comprises an eddy current sensor coil 129 embedded therein which is connected to an active element unit 130, which comprises an oscillator circuit, through a wire 131 which extends through the top ring shaft 126, and is further connected to a processor 132 through an interface board 133 including a filter circuit, and a distribution box 134 including a waveform converter circuit. In the distribution box 134, an oscillating signal is converted to a TTL level (0–5 volts), and the oscillating frequency is counted by a frequency counter within the processor 132. The oscillating frequency thus counted is displayed on a display unit 135. The eddy current sensor coil 129 and the active element unit forms an eddy current sensor.

The semiconductor wafer 124 is held below the elastic mat 127 on the bottom of the top ring 123, and the semiconductor wafer 124 is pressed onto the abrasive cloth 122 on the turn table 121 by the top ring 123, while the turn table 121 and the top ring 123 are rotated to polish the semiconductor wafer 124 with the abrasive cloth 122 through relative movements therebetween. In this event, the polishing solution Q is supplied onto the abrasive cloth 122 from the abrasive solution supply nozzle 125. The abrasive solution, suitable for polishing Cu (copper), for example, may be an oxidizer suspended with abrasive grains comprising fine particles such as alumina or silica. The semiconductor wafer is polished by a combination of the action of the polishing solution which oxidizes the surface of the Cu layer through a chemical reaction and the action of the mechanical polishing action provided by the abrasive grains.

During the polishing, the eddy current sensor 129, 130 continues to detect a change in the thickness of a conductive film such as the Cu layer formed on the polished surface of the semiconductor wafer 124. Then, a signal from the eddy current sensor 129, 130 is monitored to detect an end point for the CMP process, relying on a change in frequency which occurs when the conductive film on an oxide film ($SiO_2$) has been removed while leaving only the conductive material such as the Cu layer formed in grooves for wiring.

As mentioned above, the eddy current sensor is comprised of the sensor coil 129 which is positioned opposite to a substrate subjected to polishing, and the oscillator circuit (active element unit) 130 connected to the sensor coil 129 and including a capacitance and an active element. As the active element unit 130 is supplied with DC power, the sensor coil 129 and capacitance form a tank circuit which oscillates at its oscillating frequency with the active element such as a transistor. Magnetic flux formed by the sensor coil 129 extends through the conductive film on the substrate 124 placed in front of the sensor coil 129 and alternately changes to generate an eddy current in the conductive film. Then, this eddy current flows through the conductive film to produce an eddy current loss, causing a reduction in a reactance component of the impedance of the sensor coil 129 from a view point of equivalent circuit.

Thus, when the eddy current loss is zero, the oscillator circuit oscillates at the oscillating frequency of the tank circuit. However, as the eddy current loss exists, a resistance component in the oscillator circuit is increased due to the influence of an equivalent resistance component of a semiconductor wafer, thereby causing the oscillating frequency to move toward a higher region. Therefore, by observing a change in the oscillating frequency of the oscillator circuit, it can be seen that as a conductive film is gradually removed with the advancement of the polishing, the oscillating frequency is correspondingly reduced, and at the time the conductive film is completely removed by the polishing, the oscillating frequency becomes equal to the self oscillating frequency of the tank circuit, followed by a substantially uniform oscillating frequency. In this way, it is possible to detect an end point in the chemical mechanical polishing of a conductive film by detecting the point at which the oscillating frequency becomes equal to the self oscillating frequency of the tank circuit.

According to the end point detection for the chemical mechanical polishing process utilizing the eddy current sensor, the advancement of polishing performed on a conductive film can be known during the polishing without contacting a substrate subjected to the polishing.

The foregoing apparatus has the sensor coil 129 disposed in the top ring 123 for holding a substrate subjected to polishing, and the active element unit 130 of the oscillator circuit disposed in a fixture for holding the top ring shaft 126 spaced away from the sensor coil 129, wherein the two components are connected through the communication line 131. An oscillating signal formed by the oscillator circuit is introduced into a personal computer through the interface box 133, distribution box 134 and the like by a communication line 136, so that a transition of the oscillating frequency is displayed on a monitor screen of the computer. The communication line 136 is comprised of a total of four wires which include a pair of signal lines and a pair of DC power lines. Also, the communication line 131 is connected to the sensor coil 129 which is contained in the top ring for rotating the fixed active element unit 130 using a rotary connector. Thus, as the polishing of a conductive film advances, an eddy current loss decreases, thereby making it possible to observe how the oscillating frequency changes on the screen of the monitor 135 of the personal computer 132.

The conventional method of detecting a polishing end point based on the eddy current sensor, however, suffers from the following problems. Specifically, since the sensor coil 129 and active element unit 130 are placed at separate positions and are interconnected by the high impedance communication line 131 through the rotary connector, the communication line 131 picks up noise associated with the rotation of the turn table and the like. The removal of the noise is difficult in the course of output signal processing in the oscillator circuit. For this reason, a filter circuit or the like is required for attenuating a sufficient amount of noise. The communication line 136 also picks up noise.

Further, the oscillating frequency used for the eddy current sensor is relatively low, i.e., approximately 7 MHz, so that a large eddy current loss can be detected when a conductive film subjected to polishing has a sufficient thickness, whereas when the eddy current loss becomes smaller as the conductive film is polished more so that its thickness becomes extremely smaller, in which case difficulties are encountered in detecting, for example, a thickness of approximately 1000 Å or less. In other words, because of a relatively low oscillating frequency utilized for detection, the conventional eddy current sensor fails to provide a sufficiently high accuracy for detecting an end point for polishing performed by a polishing apparatus which requires a thickness detection accuracy on the order of angstroms.

SUMMARY OF THE INVENTION

The present invention has been proposed to solve the problems in the frequency measurement of the above-described conventional eddy current sensor, and, therefore, an object of the present invention is to provide a frequency measuring device and method capable of obtaining a frequency measurement result with high precision and in a short time interval, and a polishing device and method using the same.

Further, the present invention has an object to provide an eddy current sensor capable of operating stably and detecting an end point of the polishing accurately.

In order to achieve the objects described above, according to a first aspect of the present invention, there is provided a device for measuring a frequency of a measured signal, the device comprising:

counting means including a plurality of n-nary counters; and gate means for supplying the measured signal to an input of the respective n-nary counters in the order of given time intervals;

wherein a frequency measurement result of the measured signal is supplied from the counting means every given time interval.

According to a second aspect of the present invention, there is provided a method for measuring the frequency of a measured signal, the method comprising:

providing counting means including a plurality of n-nary counters; and supplying the measured signal to an input of the respective n-nary counters in the order of given time intervals;

wherein a frequency measurement result of the measured signal is supplied from the counting means every given time interval.

According to a third aspect of the present invention, there is provided a device for measuring the frequency of a measured signal, comprising:

a counting section including a number $i (i \geq 2)$ of n-nary counters;

a time reference circuit that outputs a time reference signal, a duration of which is t, every time interval p; and a number i of gate circuits where the respective outputs of which are connected to the inputs of the n-nary counters, each of the gate circuits having a first input that receives the measured signal, and a second input that receives the time reference signal at the time intervals p;

wherein the frequency measurement result of the measured signal is supplied from the counting section every time interval p.

It is preferable that $t = i \cdot p$.

According to a fourth aspect of the present invention, there is provided a polishing device comprising:

a turn table having a polishing surface;

a top ring for holding an object to be polished; and an end point detecting mechanism for informing an end point of the polishing;

wherein the end point detecting mechanism includes a frequency measuring device that comprises:

counting means including a plurality of n-nary counters; and gate means for supplying the measured signal to an input of the respective n-nary counters sequentially at given time intervals;

wherein a frequency measurement result of the measured signal is supplied from the counting means every given time interval.

According to a fifth aspect of the present invention, there is provided a polishing method of informing of an end point in polishing of an object by a turn table having a polishing surface, the method comprising the steps of:

providing counting means including a plurality of n-nary counters; and supplying the measured signal to an input of the respective n-nary counters in the order of given time intervals;

wherein a frequency measurement result of the measured signal is supplied from the counting means every given time interval.

Since the frequency measuring device according to the present invention has the above-mentioned structure, the present invention can provide the frequency measured result of the measured signal every given time interval at which an arbitrary length can be set, thereby resulting in such an advantage that the measured result can be obtained every period shorter than that in the conventional frequency measuring device. In addition, an outstanding effect of increasing significant digits of the measured frequency can be obtained. Therefore, by applying such a frequency measuring device to the polishing device, a precision with which the end point of polishing of the semiconductor wafer is detected can be remarkably improved.

According to a sixth aspect of the present invention, there is provided an eddy current sensor for detecting the thickness of an electrically conductive film from a change in an eddy current loss generated in the conductive film, comprising:

a sensor coil for generating an eddy current in the conductive film; and an active element unit connected to and integrally formed with the sensor coil for oscillating a variable frequency corresponding to the eddy current loss. The sensor coil is preferably in the shape of a hollow spiral, and a substrate for mounting the active element unit is preferably disposed perpendicular to the hollow spiral sensor coil. Also preferably, an oscillator circuit integrally formed of the sensor coil and active element unit is connected to a low impedance coaxial cable which may serve as a power supply line and as an oscillating signal output line.

As described above, since the oscillator circuit is integrally formed of the sensor coil forming part of the eddy current sensor, and the active element unit connected to the sensor coil, the coaxial cable can communicate signals at a low impedance (50 Ω), and the oscillator circuit can be stably operated without picking up noise caused by rotation of the turn table and the like of an associated polishing apparatus. Also, the substrate including the active element unit is disposed in a direction perpendicular to the sensor coil, so that an eddy current loss can be detected using a high oscillating frequency in the VHF band. It is therefore possible to detect an eddy current loss in a thin conductive film having a high resistivity and to detect a polishing state of a thin film on the order of angstroms such as a tantalum (Ta) film or the like which is used as a barrier layer. For this reason, a polishing end point can be detected in a significantly high accuracy.

According to a seventh aspect of the present invention, there is provided an eddy current sensor for detecting the thickness of a conductive film from a change in an eddy current loss generated in the conductive film, comprising a sensor coil for generating an eddy current in the conductive film, wherein a change in the thickness of the conductive film is detected from a change in a resistance component in an impedance formed by the sensor coil and the conductive film. Since this eddy current sensor detects a change in the thickness of a conductive film associated with the advancement of polishing by observing a change in a resistive component with the oscillating frequency left fixed, it is possible to clearly observe a polishing state of an extremely thin film at a relatively low frequency. Thus, the eddy current sensor has the ability to readily detect the thickness of an extremely thin barrier layer which has a low conductivity.

BRIEF DESCRIPTION OF THE DRAWINGS

These and other objects and features of the present invention will become more apparent when reading the following description with reference to the accompanying drawings, in which:

FIG. 6 illustrates the main portion of a conventional polishing apparatus.

DETAILED DESCRIPTION OF THE INVENTION

Figure 1:
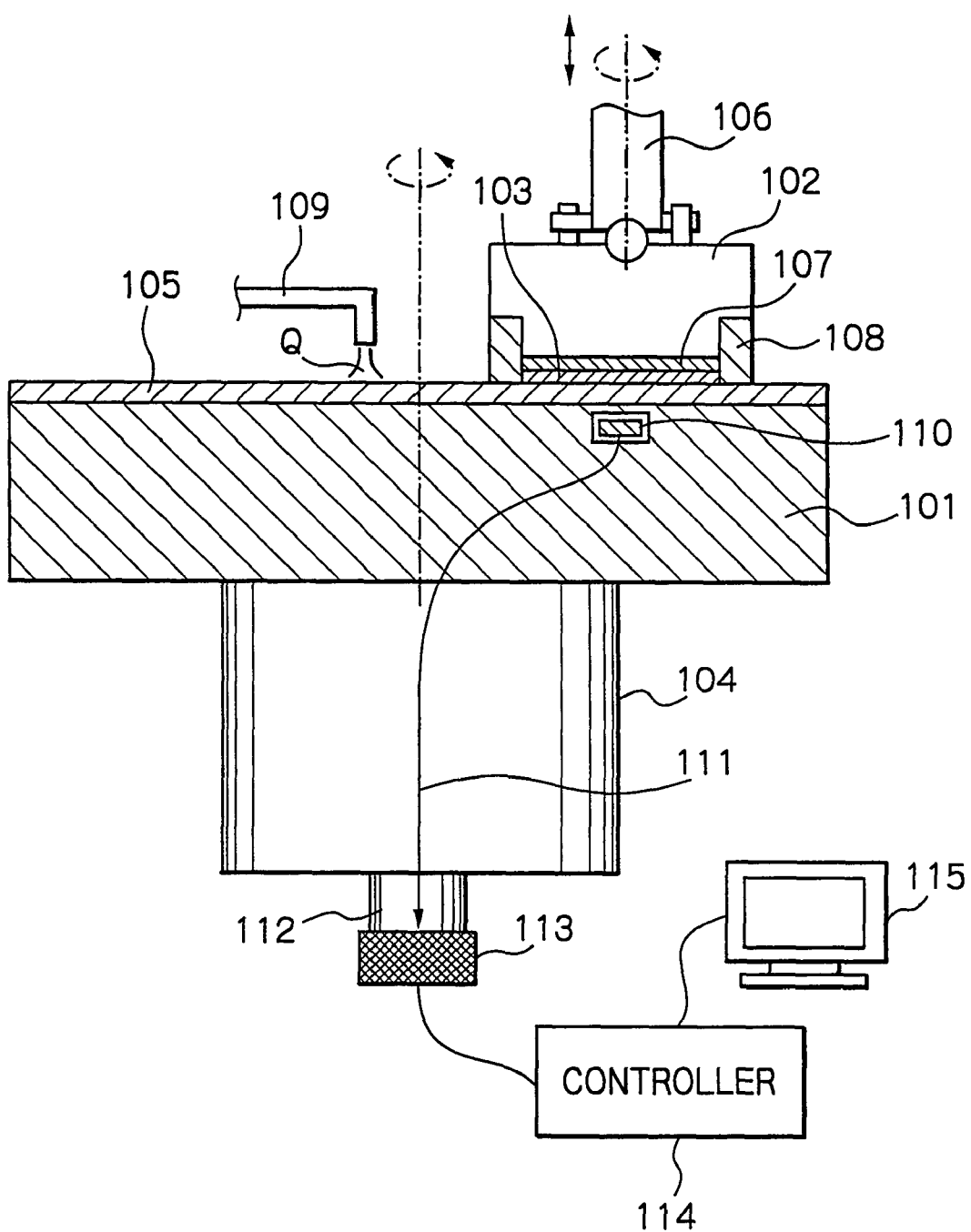
FIG. 1 is a cross-sectional view schematically showing the structure of a polishing device proposed by the applicant of the subject application.
Figure 2:
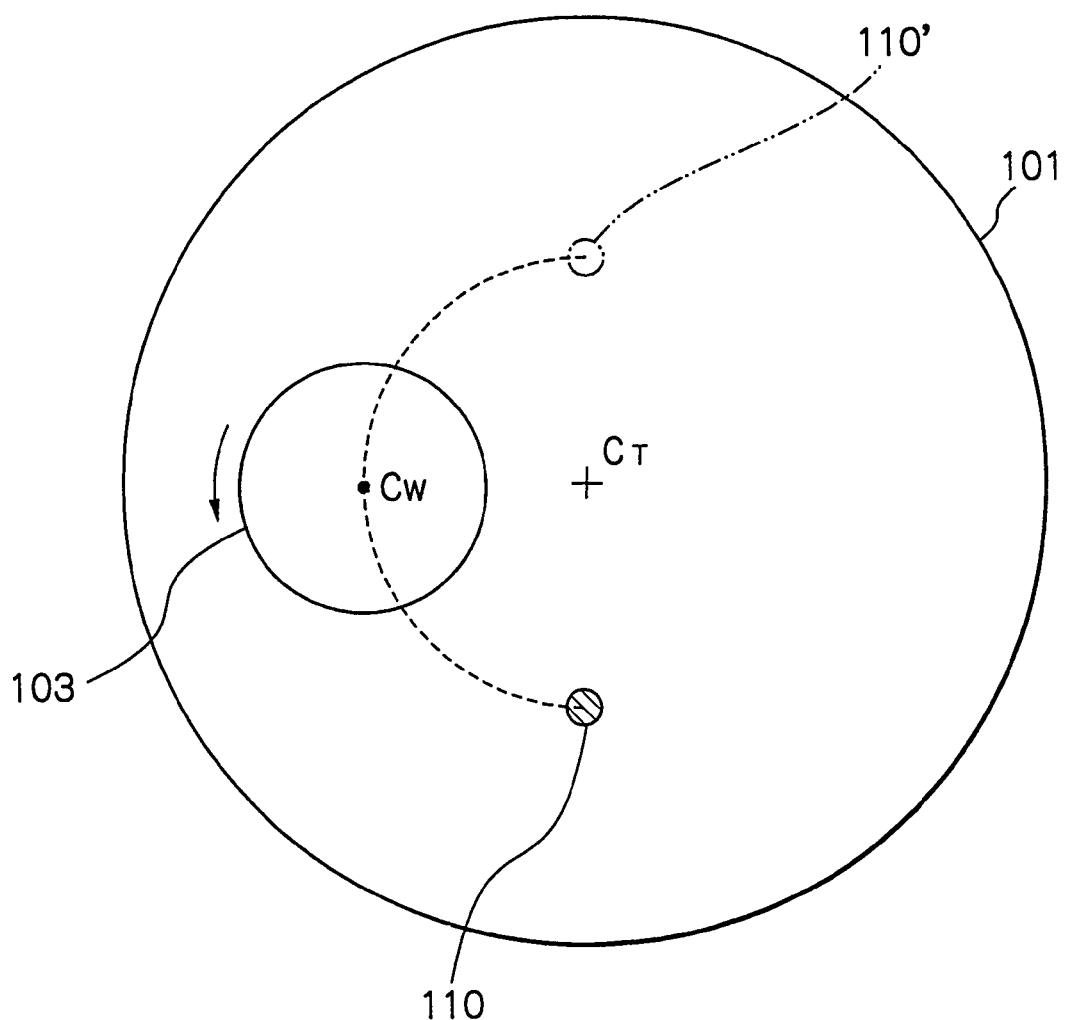
FIG. 2 is a plan view showing a positional relationship of a turn table, a semiconductor wafer and an eddy current sensor in the polishing device shown in FIG. 1.
Figure 3A:
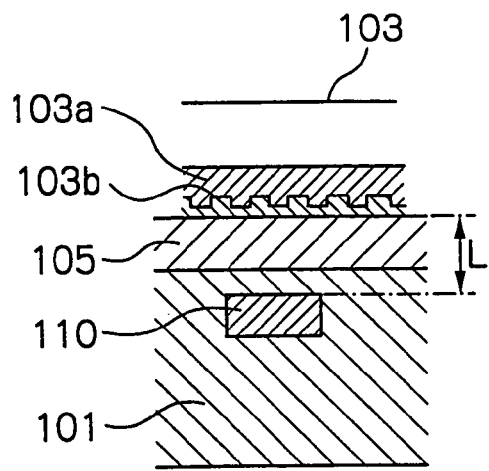
FIGS. 3a and 3b show enlarged main-portion cross-sectional views schematically showing a state in which the eddy current sensor is embedded in the polishing device shown in FIG. 1.
Figure 3B:
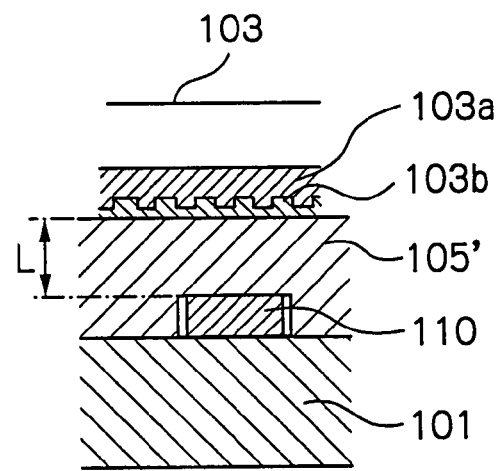
Figure 4:
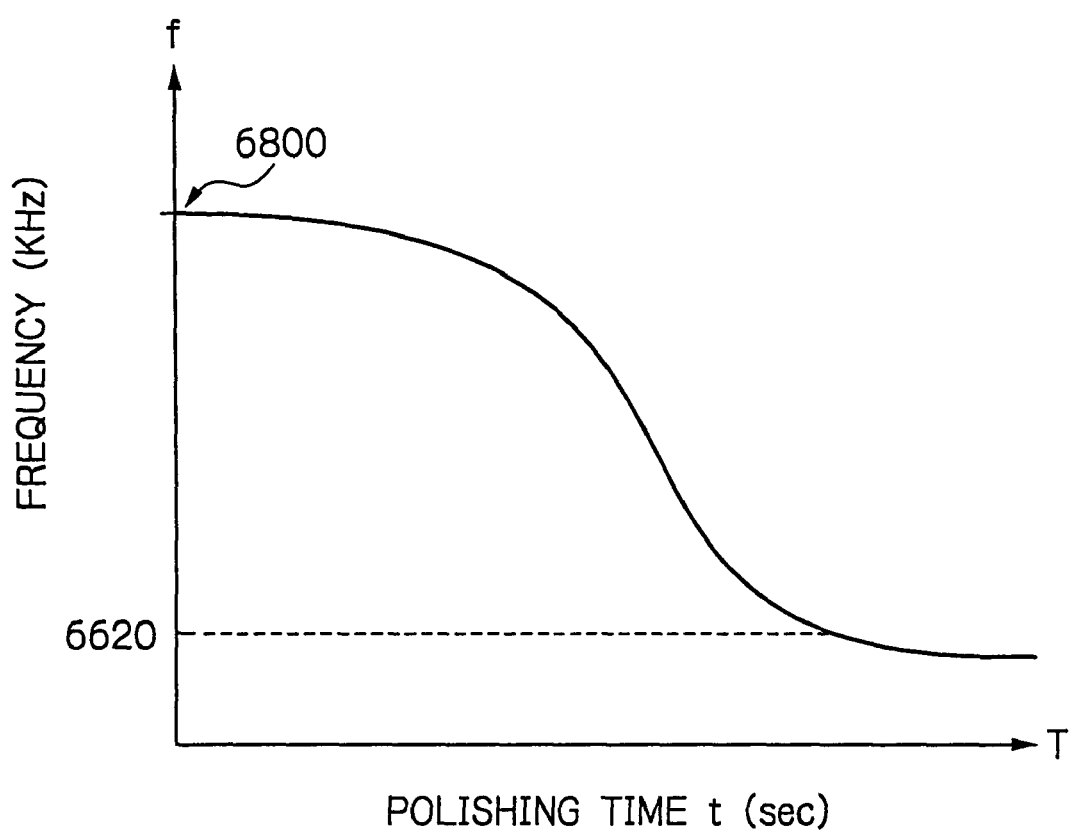
FIG. 4 is a graph showing a result of processing a detection signal of the eddy current sensor obtained during the polishing of a semiconductor wafer by the polishing device shown in FIG. 1.
Figure 5A:
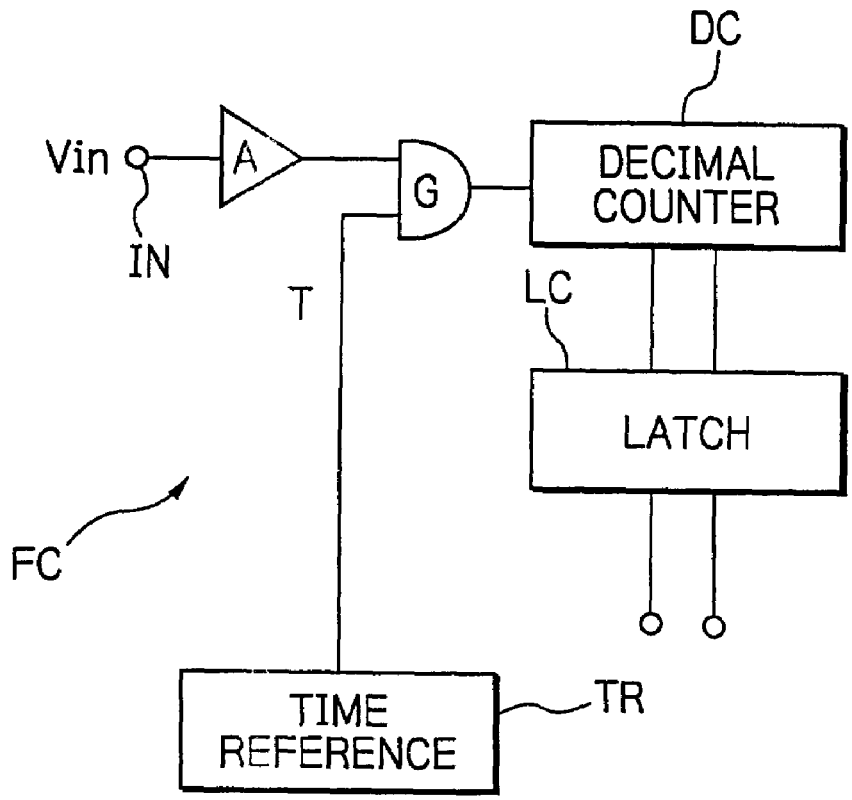
FIGS. 5a and 5b are a block diagram schematically showing the structure of a conventional frequency measuring device.
Figure 5B:
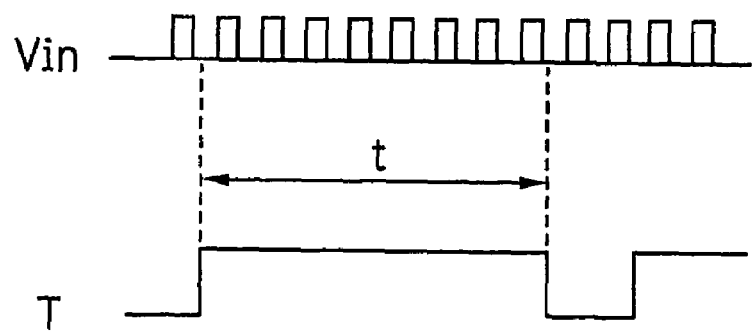

Now, a description will be given of preferred embodiments of a frequency measuring device using a sequential counting system, according to the present invention as described herein. First, referring to FIG. 7, a frequency measuring device FC includes i de counters 1, 2, 3, 4, . . . i, in which i is an integer of 2 or more. The input terminals of these decimal counters 1–i are connected to the output terminals of respective corresponding gate circuits G1–Gi, and also the outputs of the decimal counters 1–i are connected to the input terminal of a latch circuit 11 in parallel. The latch circuit 11 supplies a value latched by the latch circuit 11 to a desired processing circuit through an I/O port 12 at given intervals.

A measured signal Vin having a pulse waveform is supplied to an input terminal IN of an amplifier A, and the measured signal Vin amplified by the amplifier A is supplied to one input terminal of each of the gate circuits G1–Gi in parallel. The other input terminals of these gate circuits G1–Gi are supplied with a time reference signal T sequentially outputted from a time reference circuit 13. In order to determine the operation timing of the time reference circuit 13, a clock signal outputted from a clock oscillating circuit 14 is supplied to the time reference circuit 13.

Hereinafter, a description will be given of the frequency measurement of the signal to be measured by the frequency measuring device shown in FIG. 7. The time reference circuit 13 sequentially outputs the reference time T, whose duration is t, at given time intervals p (<t) and supplies the time reference signal T to the other input terminals of the gate circuits G1–Gi so that the respective gate circuits G1–Gi are opened in a respective order according to a delay of the time interval p and for a period of the duration time t. For example, if the time reference circuit 13 supplies the time reference signal T to the other input terminal of the gate circuit G1 to open the gate circuit G1, the time reference circuit 13 supplies the time reference signal T to the other input terminal of the gate circuit G2 to open the gate circuit G2 after the time interval p from the time when the gate circuit G1 is opened, and also supplies the time reference signal T to the other input terminal of the gate circuit G3 to open the gate circuit G3 after the time interval p from the time when the gate circuit G2 is opened. Similarly, the time reference circuit 13 opens the gate circuits G4–Gi in the order of the time intervals p, and opens the gate circuit G1 after the time interval p from the time when the gate circuit Gi is opened.

In this way, the gate circuits G1–Gi open in a respective order according to the time intervals p and repeat the opening operation in a period of the duration t. As a result, the respective decimal counters 1–i count the number of pulses of the measured signals Vin that have passed through the corresponding gate circuits G1–Gi in the period of the duration time t where the respective corresponding gate circuits G1–Gi are opened in accordance with the time reference signal T, and output the count values to the latch circuit 11 in order. In response thereto, the latch circuit 11 outputs the latched value to an I/O port 12 every time the latch circuit 11 receives the count value from any one of the decimal counters 1–i. As a result, the frequency measuring device FC can supply the frequency measuring result of the measured signal Vin every time interval p after the duration t elapses from the point when the operation has started.

Figure 7:
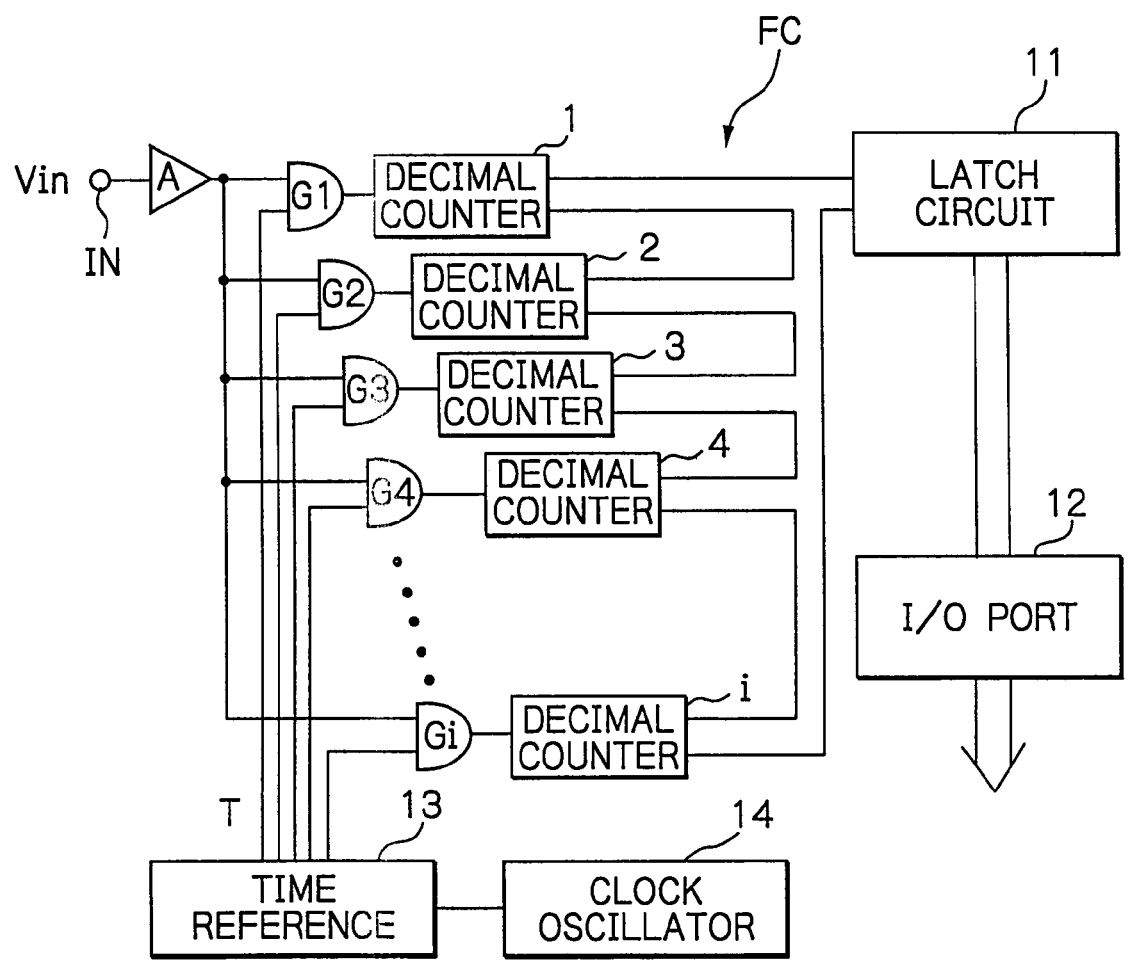
FIG. 7 is a block diagram schematically showing the structure of a first embodiment of a frequency measuring device according to the present invention.

In order that the frequency measuring device FC shown in FIG. 7 may conduct the above-mentioned operation, it is necessary that t=i·p and the number i of the decimal counters is an arbitrary integer of 2 or more. For example, when i=10, if t is 100 ms, p becomes 10 ms, and the frequency measuring device FC can supply the measured result of the frequency up to 10 MHz with the significant digits of 6 digits every 10 ms after 100 ms elapses from the time when the operation has started. Also, assuming that i=2, t is 100 ms, and p is 50 ms, the frequency measuring device FC can supply the measured result of the frequency up to 10 MHz with the significant digits of 6 digits every 50 ms after 100 ms elapses from the time when the operation has started, and assuming that i=5, t is 100 ms, and p is 20 ms, the frequency measuring device FC can supply the measured result of the frequency up to 10 MHz with the significant digits of 6 digits every 20 ms after 100 ms elapses from the time when the operation has started.

In FIG. 7, decimal counters are used, but, the present invention is not limited thereto, and arbitrary n-nary digital counters can be used. For example, in FIG. 8, which schematically shows a frequency measuring device in accordance with another embodiment of the present invention, i binary counters are used. That is, the frequency measuring device FC has 20-bit binary counters 21, 22, 23, 24, . . . , 2i, and the inputs of these binary counters 21–2i are supplied with the outputs of the respective corresponding gate circuits G1–Gi. In this case, since a binary measured signal is outputted from the latch circuit 11, a binary-to-decimal converting circuit 15 is disposed at the output side of the latch circuit 11, and the binary measured result is converted into the decimal measured result.

Figure 8:
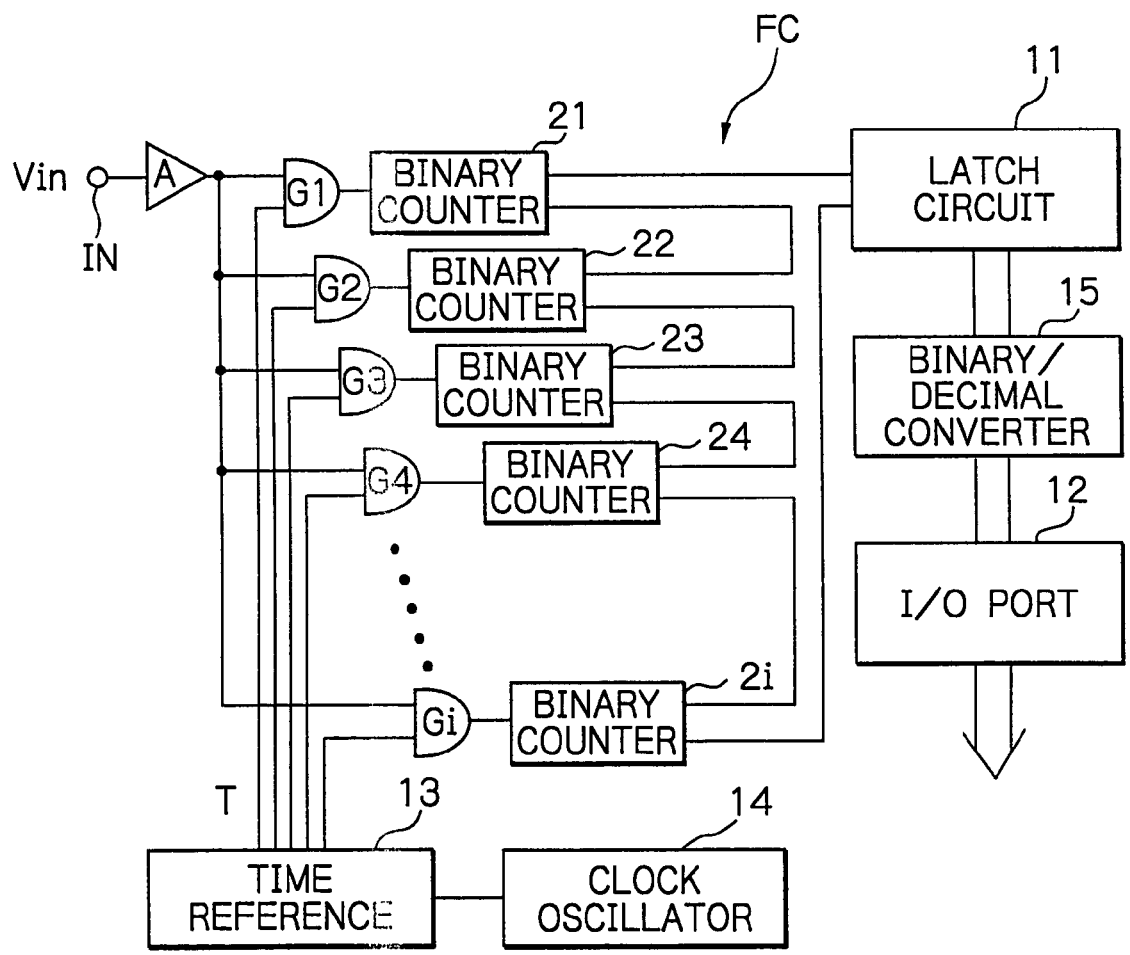
FIG. 8 is a block diagram schematically showing the structure of a second embodiment of a frequency measuring device according to the present invention.

In the operation of the frequency measuring device FC shown in FIG. 8, the operation of the gate circuits G1–Gi, the time reference circuit 13, the I/O port 12 and the clock oscillating circuit 14 are identical with that in the first embodiment shown in FIG. 7 except that the binary counters 21–2i output the frequency measured result in binary form and the latch circuit latches the binary number, and therefore a description thereof will be omitted here.

As described above, since the frequency measuring device shown in FIGS. 7 and 8 can supply a frequency measured result at intervals shorter than that of the conventional device, such a frequency measuring device can be applied to the end point detecting mechanism of the polishing device shown in FIG. 1, thereby making it possible to detect the end point of polishing with higher precision.

Figure 9:
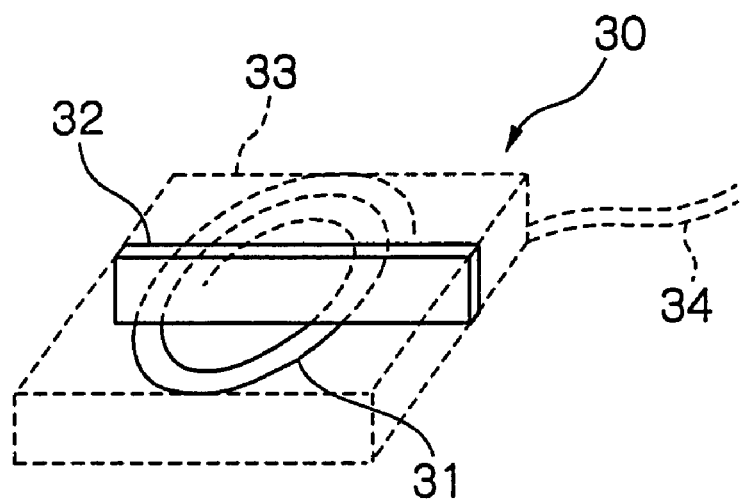
FIG. 9 is a perspective view schematically illustrating the structure of an eddy current sensor according to the present invention.

FIG. 9 schematically illustrates the structure of an eddy current sensor according to an embodiment of the present invention. The illustrated eddy current sensor 30 comprises a sensor coil 31 for generating an eddy current in a conductive film, and an active element unit 32 integrated with and connected to the sensor coil 31 to form an oscillator circuit for generating a variable frequency signal corresponding to an eddy current loss. The sensor coil 31 and a substrate (not shown) mounting the active element unit 32 thereon are accommodated in a box 33. The box 33 has a length and a width of approximately 20 mm or less, and a height of approximately 10 mm or less. A coaxial cable 34 having an impedance of approximately 50 (is connected to the active element unit 32 for supplying the eddy current sensor 30 with DC power. The cable 34 also serves as an output line for routing out an oscillating signal.

The sensor coil 31 is in the shape of a hollow spiral having two turns in this embodiment. The substrate mounting thereon the active element unit 32, which comprises the oscillator circuit, is positioned perpendicular to the hollow spiral sensor coil 31, so that the sensor coil 31 does not generate an eddy current in a conductive material on the substrate which includes the active element unit 32. Specifically, if the sensor coil 31 was positioned in parallel with the substrate mounting the active element unit 32 thereon, magnetic flux generated from the sensor coil 31 would induce an eddy current in the conductive material on the circuit substrate. Then, the eddy current sensor would detect this eddy current loss, thereby resulting in a degraded accuracy. In addition, for the substrate which mounts the active element unit 32 thereon, the eddy current generated in the conductive film on the substrate is not preferable for its operation. Therefore, disposing the sensor coil 31 perpendicular to the substrate including the active element unit 32 enables the resulting eddy current sensor to accurately measure an eddy current loss at a high oscillating frequency, for example, on the order of 200 MHz, as will be described later in greater detail.

A Colpitts-type oscillator circuit, for example, may be employed for the active element unit 32, wherein a tank circuit is formed from the inductance of the sensor coil 31 and the capacitance of a capacitor mounted on the substrate. As described above, the oscillating frequency of the eddy current sensor is determined by the oscillating frequency of the tank circuit. Also as described above, an eddy current loss causes a corresponding change in a reactance component with equivalent impedance of the sensor coil 31 to shift the oscillating frequency.

Figures 10A, 10B:
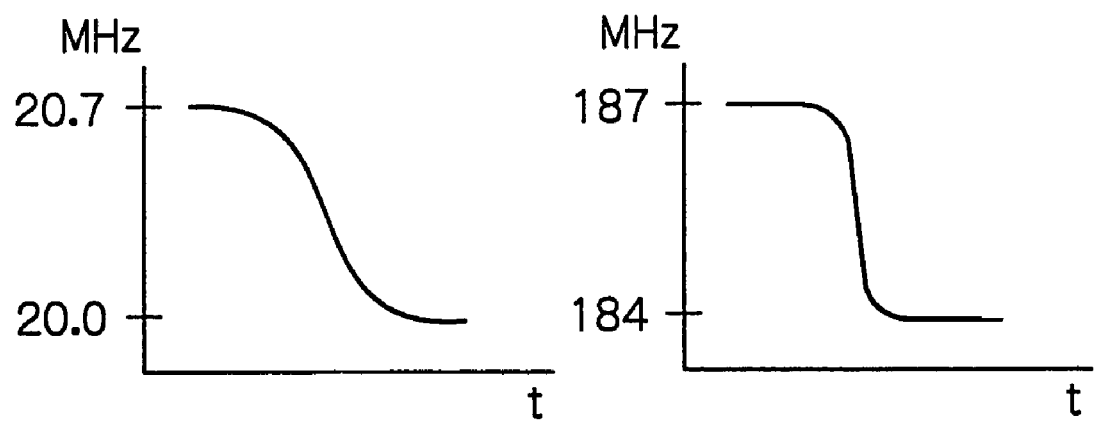
FIGS. 10a and 10b are graphs showing how an oscillating frequency changes with the advancement of polishing.

In the embodiment shown in FIG. 9, the oscillating frequency is set to approximately 200 MHz in a VHF band by appropriately selecting the inductance of the sensor coil 31 and the capacitance of the capacitor mounted on the active element unit 32. The selection of such an oscillating frequency results in a detection sensitivity corresponding to the resistivity of a conductive layer which generates an eddy current loss. Specifically, an electrically conductive film possibly subjected to chemical mechanical polishing may generally comprise a barrier layer made of tantalum (Ta) film, and a plating layer made of copper (Cu) deposited on the barrier film. The tantalum (Ta) film has the resistivity of approximately 160 Ω, while the copper (Cu) has the resistivity of approximately 1.6 Ω, from which a difference of approximately 100 times is appreciated between the two materials. When the conductive film is made of copper (Cu), a resulting oscillating frequency is detected at approximately 20 MHz, a good accuracy, as shown in FIG. 10a. Specifically, with the copper film having a sufficient thickness, the oscillating frequency is detected around 20.7 MHz. When most of the copper (Cu) film has been removed, the oscillating frequency is detected around 20.0 MHz. Thus, a sufficient detection window is provided over approximately 0.7 MHz between a conductive film having a sufficient thickness and the conductive film being substantially removed. For a tantalum (Ta) film used as a barrier layer, an oscillating frequency is generated at approximately 187 MHz when the tantalum (Ta) film has a sufficient thickness, and at 184 MHz when the tantalum (Ta) film has been substantially removed. As is the case with the copper film, a sufficient detection window is provided on the order of 3 MHz.

The tantalum (Ta) film, serving as a barrier layer, has a thickness on the order of angstroms, while the copper (Cu) film has a thickness on the order of micrometers (μm). Therefore, the eddy current sensor 30 illustrated in FIG. 9 is capable of detecting the advancement of polishing an extremely thin tantalum (Ta) film which forms a barrier layer. Specifically, for detecting the advancement of polishing a copper film using the oscillating frequency at 7 MHz, the end point of the polishing is detected, for example, with an error of approximately 1000 Å, whereas the end point for polishing of the extremely thin tantalum (Ta) film or the barrier layer can be detected on the order of angstroms using the oscillating frequency set at approximately 180 MHz. In this way, the accuracy can be significantly improved for detecting the end point of the polishing.

Figure 11:
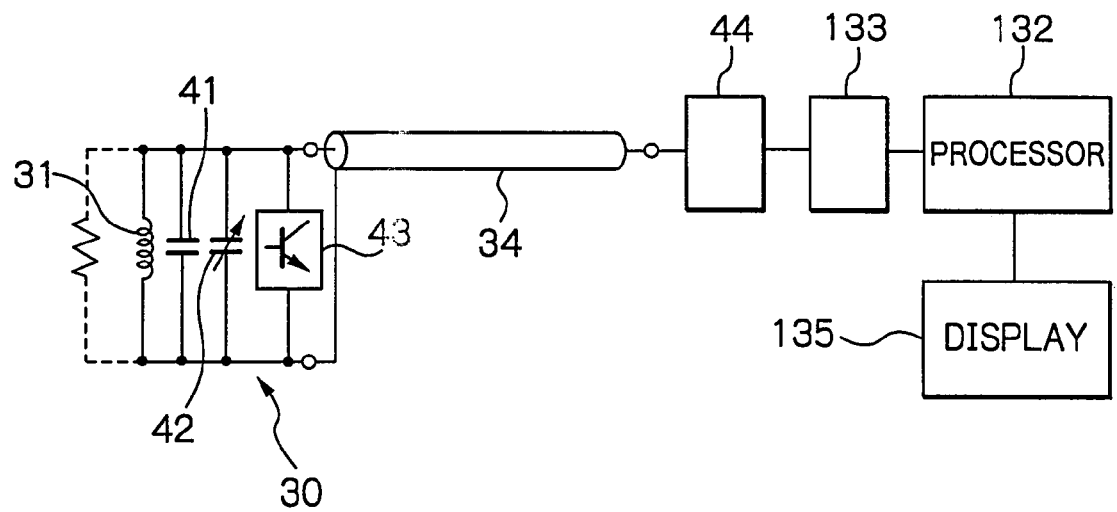
FIG. 11 is a circuit block diagram illustrating a detector circuit for detecting an oscillating signal of the eddy current sensor shown in FIG. 9.

FIG. 11 illustrates a detector circuit using the eddy current sensor 30 for detecting an eddy current loss. As described above, the eddy current sensor 30 comprises the sensor coil 31, capacitors 41, 42 which form a tank circuit together with the sensor coil 31, and an active circuit element 43 such as a transistor or the like. The capacitance includes a fixed capacitor 41 and a variable capacitor 42. The variable capacitance 42 forms part of an automatic frequency tuning circuit, as later described in detail. A divider or a subtractor 44 and a distribution board 134 (FIG. 6) for performing a waveform conversion are connected to the eddy current sensor 30 through a coaxial cable 34. As described above, the coaxial cable 34 serves as a power supply line as well as a signal line, so that an oscillating signal from the eddy current sensor 30 is fed to the oscillating signal detector circuit through a coupling capacitor and DC power is supplied from the interface board 133. The divider is provided for the purpose of dividing the detected oscillating frequency, and its resolution can be increased by removing a majority of fixed components with respect to a variable component through a subtractive operation of the subtractor.

An oscillating signal detecting circuit in a processor 132 relies on a change in the eddy current loss associated with the advancement of polishing to detect how the polishing is advanced. Generally, two possible methods may be employed for this purpose. A first method involves detecting a change in the oscillating frequency of the oscillating signal. As shown in FIGS. 10a and 10b, as a conductive film is increasingly polished, the eddy current loss also changes and an equivalent resistance value of the sensor coil changes. This results in a change in the oscillating frequency of the oscillator circuit, so that a signal corresponding to the frequency within the detection window is displayed on a monitor by dividing the oscillating signal using the divider or by subtracting the same using the subtractor. Consequently, the graphs as shown in FIGS. 10a and 10b are drawn for indicating the trajectories of the changing frequencies.

When a conductive film subjected to polishing has a sufficient thickness, a small change is given in the eddy current loss associated with the advancement of the polishing (over time t), thus resulting in a small change in the oscillating frequency. As the polishing is advanced to reduce the thickness of the conductive film, the eddy current loss suddenly decreases. This causes a sudden decrease in the oscillating frequency as well. Eventually, when the residual conductive film is completely removed, the oscillating frequency remains substantially constant because of the absence of the conductive film even though an underlying oxide film is subsequently polished. Thus, the end point is defined at a point at which the oscillating frequency substantially settles after its sudden decrease. The output of the eddy current sensor undergoes a moving average calculation and then differentiation. The polishing end point can be accurately detected by observing the result of differentiation.

Figure 12:
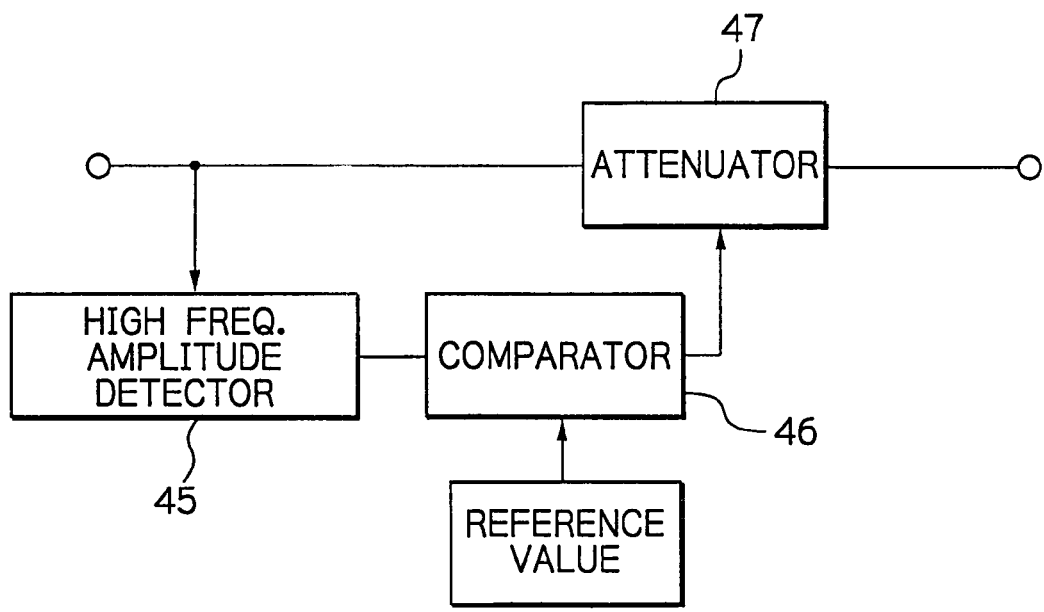
FIG. 12 is a block diagram illustrating an amplitude adjusting circuit in FIG. 11.

By communicating the oscillating frequency detected by the oscillating frequency detecting unit to a controller circuit and by changing the capacitance of the variable capacitor (varicap) 42, a shift in the oscillating frequency is automatically corrected through automatic frequency tuning. The automatic frequency tuning can suppress fluctuations in the self oscillating frequency of the sensor for eliminating an individual difference of the sensor to stabilize the sensitivity for the output signal frequency from the eddy current sensor, thereby eliminating variations in the eddy current sensor itself due to the manufacturing accuracy. For stabilizing the oscillating amplitude of the oscillator circuit using an automatic amplitude control (ALC) method to provide a constant amplitude, a high frequency amplitude detector 45 may be provided in the oscillating signal detector circuit for detecting a signal, the magnitude of which is compared with a reference amplitude signal in a comparator 46 which manipulates an attenuator 47 to control the amplitude constant, as illustrated in FIG. 12. The introduction of such a circuit provides for a stabilized operation for a conversion of the high frequency signal from the eddy current sensor to a TTL level signal as well as for a stable S/N ratio.

Figure 13A:
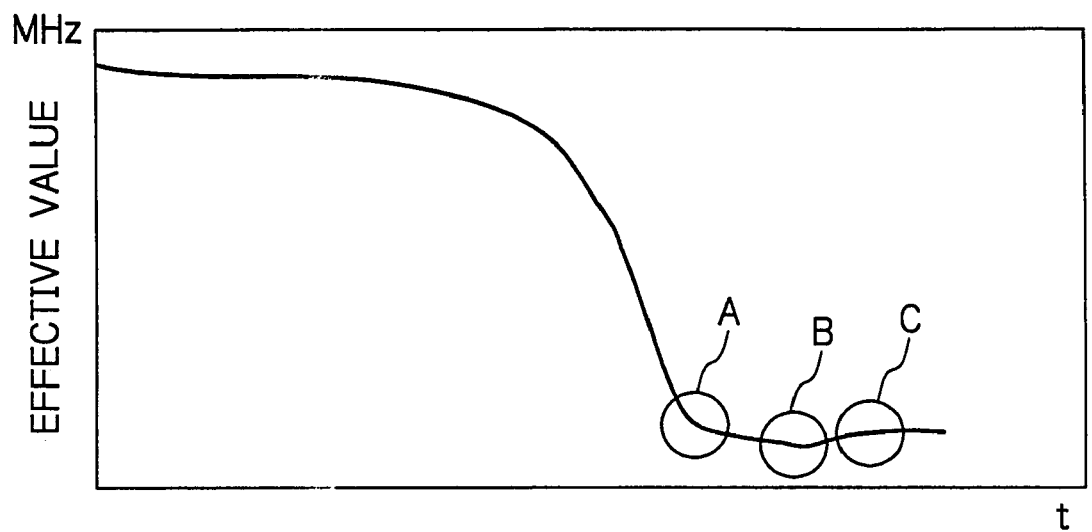
FIG. 13a is a graph showing a trajectory of a change in the oscillating frequency.
Figure 13B:
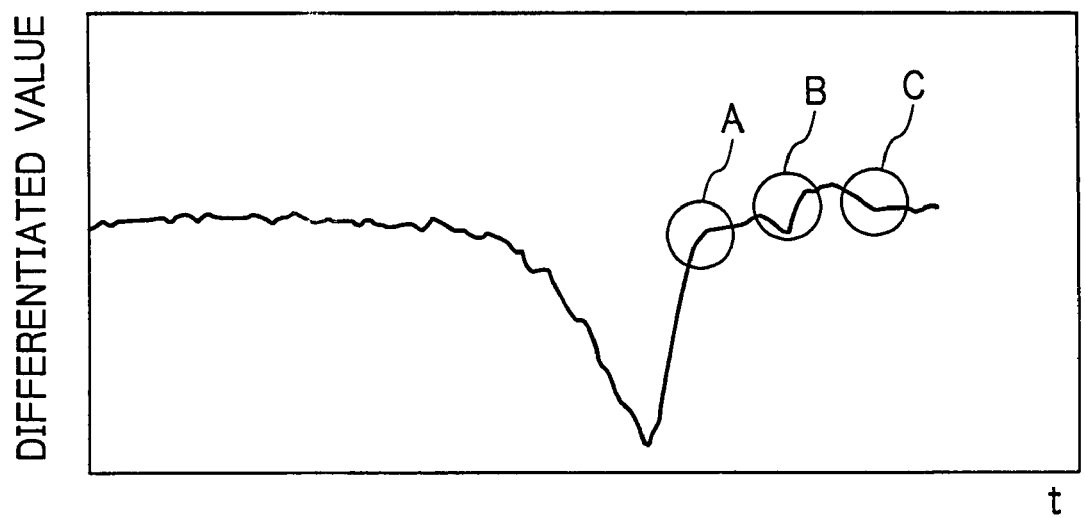
FIG. 13b is a graph showing a trajectory of a change in a time-differentiated value of the oscillating frequency.

The oscillating frequency signal from the eddy current sensor may be regarded as a temporal gradient change of frequency, in other words, the oscillating frequency may be differentiated with respect to the time, and the polishing end point can be determined from characteristic points on a resulting curve which represents the differentiated oscillating frequency over time. FIG. 13a shows a trajectory of a change in the oscillating frequency itself over time t, and FIG. 13b shows a trajectory of the differentiated oscillating frequency. In these graphs, A indicates a time point at which a metal layer is removed; B indicates a time point at which a first barrier layer is removed; and C indicates a time point at which a second barrier layer is removed. Even though the oscillating frequency itself presents a slight change, the differentiated values may be observed to readily detect the end point for the polishing of a barrier layer in the order of angstroms.

Figure 14:
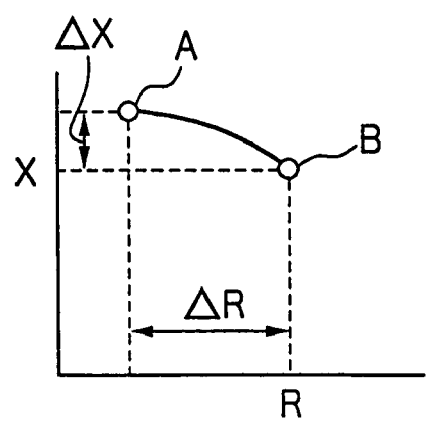
FIG. 14 is a graph showing a trajectory of a change in an equivalent impedance as measured by an LCR meter.

A second eddy current loss detecting method involves directly measuring a resistance component in equivalent impedance of the eddy current loss caused by the sensor coil 31 using an LCR meter. The LCR meter may be used as the signal detector circuit in FIG. 11 to display the resistance R on the horizontal axis and the reactance X on the vertical axis on a monitor screen as illustrated in FIG. 14. From the fact that an eddy current loss in a conductive film changes with the advancement of polishing, it is possible to observe how the resistance R and reactance X take a trajectory associated with the change in the eddy current loss in the conductive film. Specifically, at point B, a large amount of conductive film still remains so that a large eddy current loss is generated, while at point A, the conductive film is polished to complete removal thereof, with the resulting elimination of the eddy current loss, so that a fixed resistance component remains alone when viewed from the impedance meter. As shown in FIG. 14, a change in impedance of the sensor is expressed by:

$$\Delta R >> \Delta X$$

As noted, the reactance component ($\Delta R$) presents a significantly larger change than the resistance component ($\Delta X$) does. If a result of measurement deviates from a predetermined range when the polishing apparatus is being operated using the eddy current sensor, the sensor is determined to fail, and an error signal is generated. Then, the polishing can be interrupted to minimize the influence upon failure.

Figure 15:
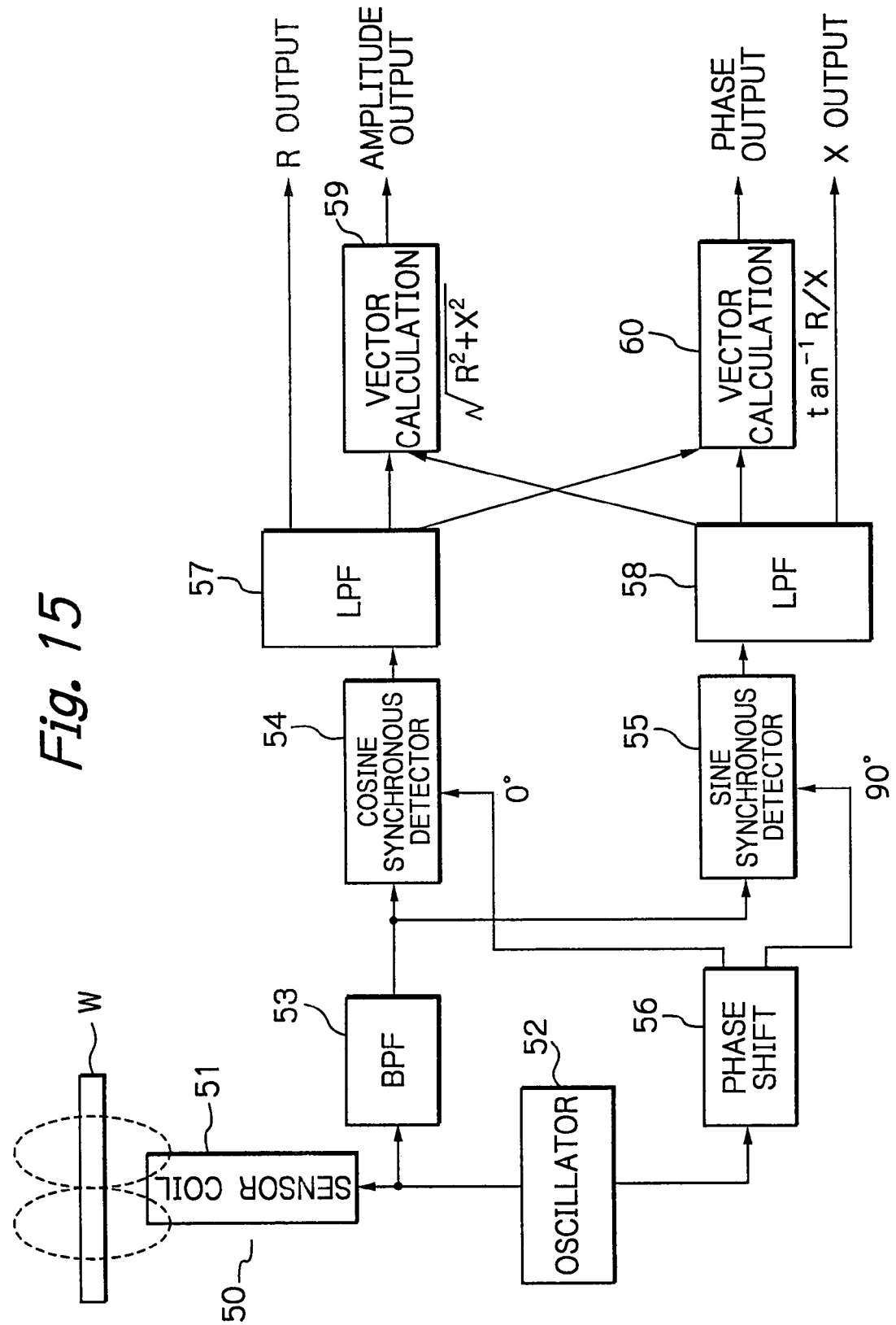
FIG. 15 is a block diagram illustrating the structure of another embodiment of an eddy current sensor according to the present invention.

FIG. 15 illustrates another embodiment of an eddy current sensor according to the present invention. A sensor coil 51 of an eddy current sensor 50 is in the shape of hollow spiral, similar to that of the eddy current sensor 30 in the first embodiment. The actually employed coil 51 has, for example, two turns. The sensor coil 51 is positioned near a semiconductor wafer W having a conductive film, subjected to polishing, deposited thereon. A signal source for supplying the sensor coil 51 with an AC signal is an oscillator unit 52 including a quartz oscillator at a fixed frequency, which generates signals at fixed frequencies of 8, 16, 32 MHz, by way of example. A voltage detected across the sensor coil 51 passes through a bandpass filter 53 which passes therethrough an oscillating frequency of the oscillator unit 52. Then, a cosine (cos) component and a sine (sin) component are extracted from the detected signal by a synchronous detector unit which includes a cos synchronous detector circuit 54 and a sin synchronous detector circuit 55. A phase shifter circuit 56 generates two signals, i.e., an in-phase component (0°) and a quadrature component (90°) from the oscillating signal generated by the oscillator unit 52. The two components are introduced into the cos synchronous detector circuit 54 and sin synchronous detector circuit 55, respectively, for performing synchronous detection, as described above.

Synchronously detected signals have their unnecessary high frequency components above signal components removed by low pass filters 57, 58, respectively, to extract a resistance component (R) output which is the cos synchronous detection output, and a reactance component (X) output which is the sin synchronous detection output. Also, a vector calculating circuit 59 calculates an amplitude output $(R^2+X^2)^{1/2}$ from the R component output and X component output. Similarly, a vector calculating circuit 60 calculates a phase output $(\tan^{-1} \cdot R/X)$ from the R component output and X component output.

Figure 16:
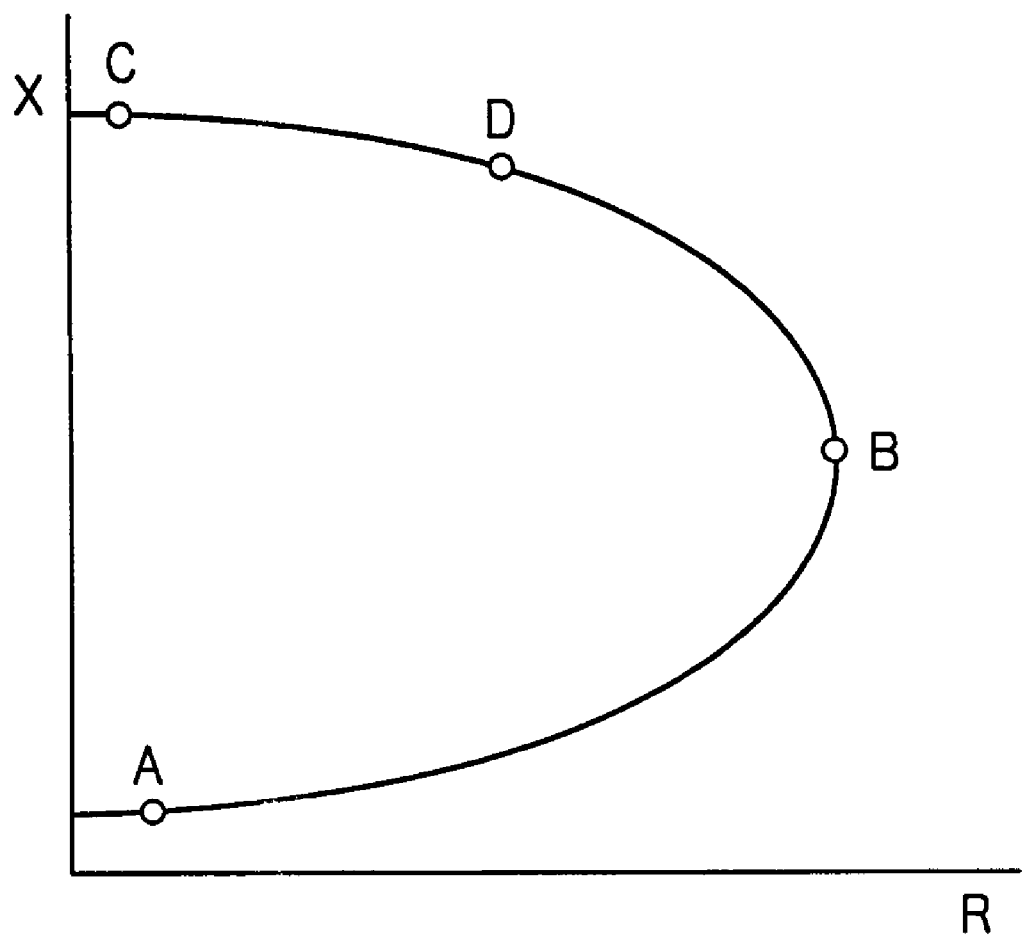
FIG. 16 shows a trajectory of changes in a resistance component (R) vs. a reactance component (X) associated with a change in thickness, as detected by the eddy current sensor illustrated in FIG. 15.

FIG. 16 shows an exemplary result of measuring the thickness of a conductive film using the eddy current sensor 50, where the horizontal axis represents the resistance component (R), and the vertical axis represents the reactance component (X). A point A is observed when the thickness is extremely large, for example, 100 µm or more. At the point A, the impedance viewed from the sensor coil presents an extremely small resistance component (R) viewed from the sensor coil since an extremely large eddy current loss is generated in the conductive film placed near the sensor coil. As the polishing is advanced so that the conductive film becomes thinner, the resistance component (R) as well as the reactance component increase as viewed from the sensor coil. The point at which the resistance component (R), viewed from the sensor coil, reaches its maximum is indicated by B. As the polishing is further advanced to thin the conductive film, the resistance (R) component viewed from the sensor coil becomes gradually smaller as the eddy current loss is gradually reduced. Eventually, when the conductive film is completely removed by the polishing, no eddy current loss exists so that the resistance component (R) caused by the eddy current loss becomes zero, leaving only the resistance of the sensor coil itself The reactance component (X) at this time shows the reactance component of the sensor coil itself This state is indicated by a point C.

Actually, for depositing a copper wire in a groove formed in a silicon oxide film by a so-called Damascene process, a barrier layer made of tantalum nitride (TaN), titanium nitride (TiN) or the like is deposited on the silicon oxide film, and a metal wire made of highly conductive copper, tungsten or the like is deposed on the barrier layer. Therefore, the detection of an end point for polishing the barrier layer is critical in polishing the conductive film. However, as mentioned above, the barrier layer employed herein is made of a film having a relatively low conductivity such as tantalum nitride (TaN), titanium nitride (TiN) or the like in an extremely small thickness on the order of angstroms.

The eddy current sensor according to the second embodiment of the present invention can readily detect the thickness of a barrier layer as mentioned above near the polishing end point. Specifically, as shown in FIG. 16, a point D indicates a position at which the thickness is approximately 1000 Å. From the point D to the point C at which the thickness is zero, the resistance component exhibits an extremely large and substantially linear change in correspondence with a reduction in the thickness. In this event, the reactance component (X) exhibits an extremely small amount of change as compared with the resistance component, as can be seen from FIG. 16. For this reason, the aforementioned eddy current sensor 30 according to the first embodiment, which relies on the basic idea that the thickness is detected based on a change in the oscillating frequency caused by a change in the reactance component, merely detects an extremely small change in the oscillating frequency with respect to the change in the thickness. For increasing the resolution for the frequency change to overcome this disadvantage, the oscillating frequency must be increased as described above. In contrast, the eddy current sensor 50 according to the second embodiment relies on a change in a resistance component to detect a change in thickness with the oscillating frequency left unchanged, thereby making it possible to clearly observe how an extremely thin film is polished at a relatively low frequency.

Figure 17A:
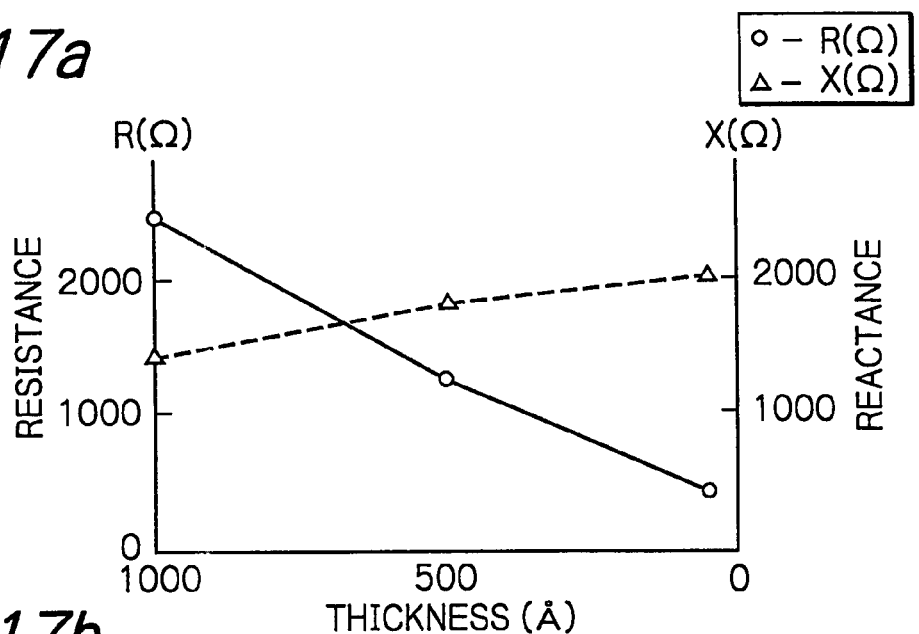
FIGS. 17*a*, 17*b* and 17*c* are graphs each showing an exemplary change in the resistance component (R) and reactance component (X) caused by a change in thickness.
Figure 17B:
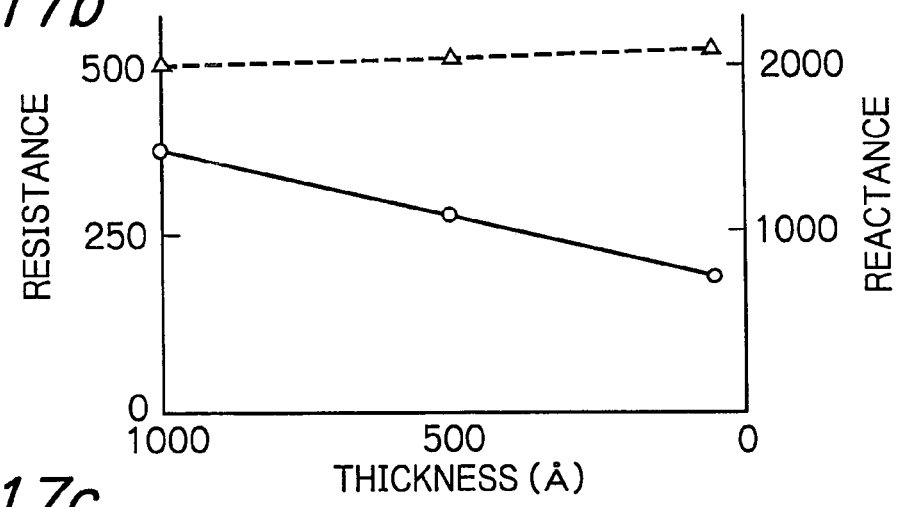
Figure 17C:
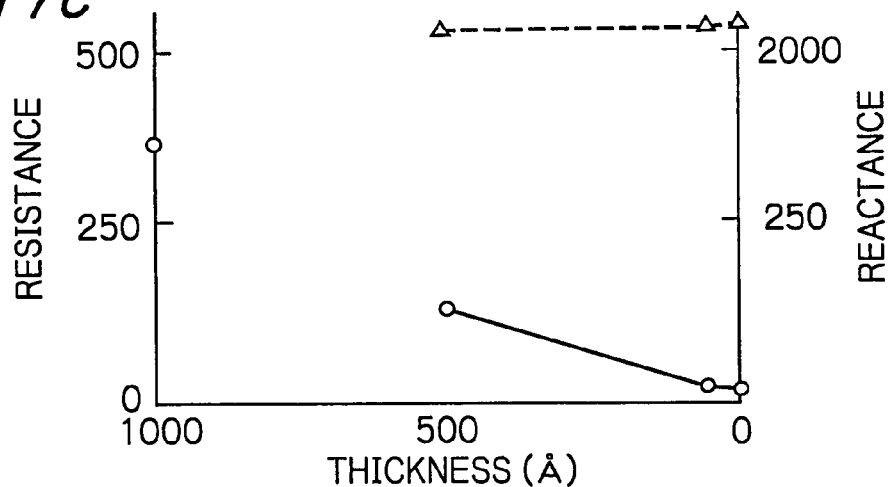

FIGS. 17a, 17b and 17c show results of detecting the thickness of an extremely thin conductive film on the order of angstroms, where the horizontal axis represents a remaining thickness; the left-hand vertical axis represents a resistance component (R); and the right-hand vertical axis represents a reactance component (X). FIG. 17a shows data on a tungsten (W) film, from which it can be seen that a change in thickness can be clearly detected by observing a change in resistance with the remaining film having an extremely small thickness of 1000 Å or less. FIG. 17b shows data on a titanium nitride (TiN) film, from which it can be similarly seen that a change in thickness can be clearly detected in a region of 1000 Å or less. FIG. 17c shows data on a titanium (Ti) film, in which a change in thickness can be clearly detected since the resistance component changes from approximately 100 Ω or more to approximately 0 Ω while the thickness is reduced from 500 to 0 Å, as can be seen in FIG. 10C.

Preferably, the signal source generates a higher oscillating frequency, for example, approximately 32 MHz for detecting a barrier layer which has a relatively low conductivity. A higher oscillating frequency allows for a clear observation of a change in the thickness of the barrier layer from 0 to 250 Å. On the other hand, with a metal film such as a copper film, a tungsten film or the like having a relatively high conductivity, a change in thickness can be clearly detected with a low oscillating frequency. In this way, the oscillating frequency is preferably selected depending on the type of film subjected to the polishing.

In each of the examples shown in FIGS. 17a–17c, the reactance component (X) presents an extremely small change with respect to a change in the resistance component (R). In the examples of detecting the thickness of the barrier layer, a change in the reactance component (X) is 0.005% with a tantalum film having a remaining thickness of 0 Å and 250 Å, whereas a change in the resistance component (R) is 1.8%. It is appreciated that the detection sensitivity is improved by a factor of approximately 360 over the conventional method which relies on a change in the reactance component.

The foregoing exemplary method of detecting a film thickness mainly relies on a change in the resistance component (R). However, the eddy current sensor 50 illustrated in FIG. 15 can extract an amplitude output and a phase output associated with the advancement of polishing. Therefore, these signal outputs may be used to check for the advancement of polishing in multiple aspects, for example, by measuring the thickness based on a detected phase angle.

Figure 18:
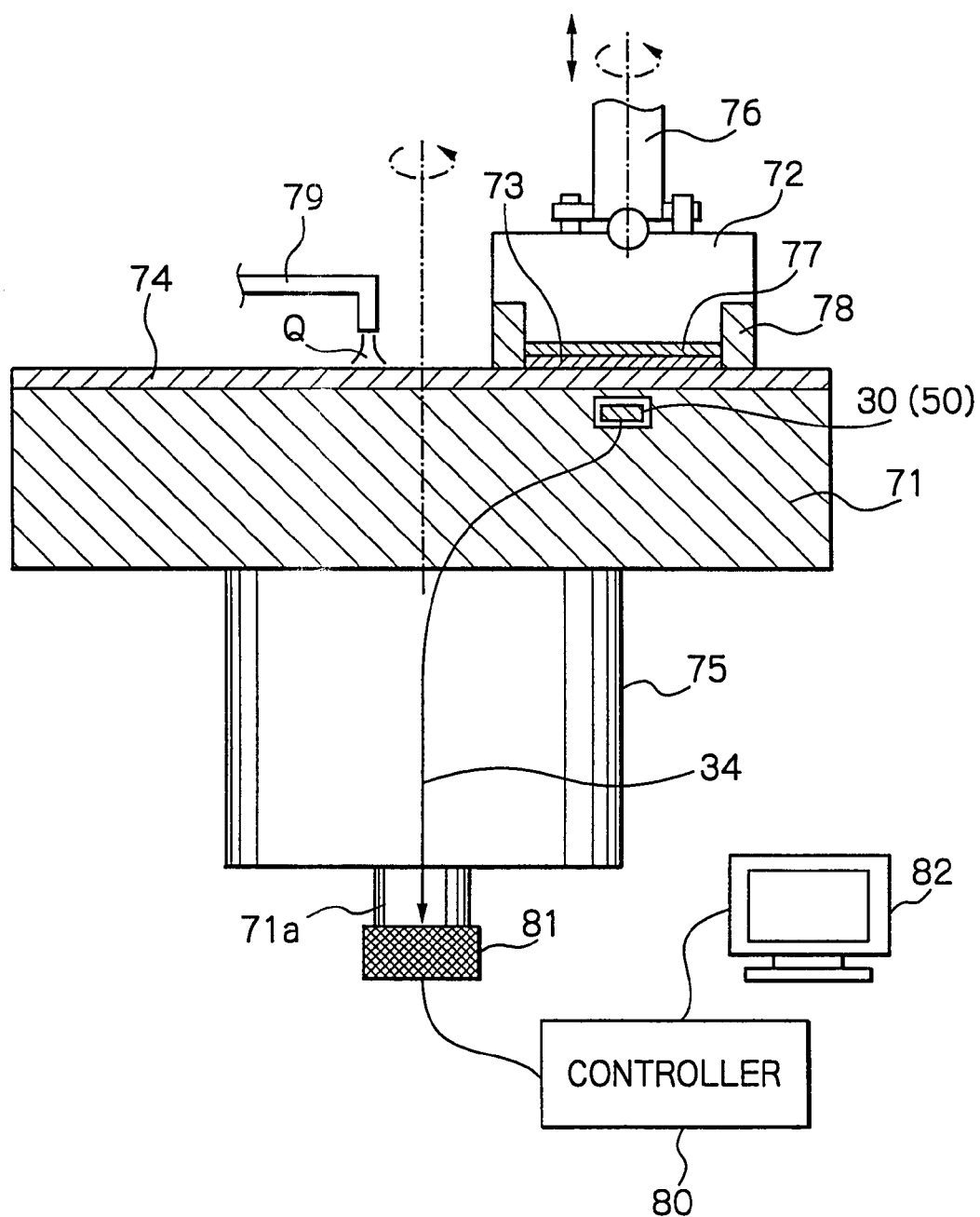
FIG. 18 is a vertical sectional view schematically illustrating an overall structure of a polishing apparatus according to the present invention.

FIG. 18 is a vertical sectional view generally illustrating the configuration of a polishing apparatus which employs the foregoing eddy current sensor 30 or 50. As illustrated in FIG. 18, the polishing apparatus comprises a turn table 71, and a top ring (holder) 72 for holding and pressing a semiconductor wafer 73 onto an abrasive cloth 74 on the turn table 71. The turn table 71 is coupled to a motor 75 to be rotatable about the center axis thereof, as indicated by an arrow. The top ring 72 is coupled to a motor (not shown) as well as to an elevating cylinder (not shown). In this structure, the top ring 72 can be moved up and down and rotated about the center axis as indicated by arrows, such that the semiconductor wafer 73 can be pressed onto the abrasive cloth 74 with an arbitrary force. The top ring 72 is coupled to a top ring shaft 76, and also includes an elastic mat 77 made of polyurethane or the like on the bottom. The top ring 72 is also provided with a guide ring 78 around the outer periphery of a lower portion of the top ring 72 for preventing the semiconductor wafer 73 from coming off. A polishing solution nozzle 79 is disposed above the turn table 71 for supplying a polishing solution Q onto the abrasive cloth 74 adhered on the turn table 71.

As illustrated in FIG. 18, an eddy current sensor 30 or 50 is embedded in the turn table 71. The eddy current sensor 30 or 50 is connected to a controller 80 by a connection cable 34 (FIG. 9) which is routed through the inside of the turn table 71 and turn table supporting shaft 71a, and through a rotary connector (or a slip ring) 81 disposed at an end of the turn table supporting shaft 71a. The controller 80 is connected to a display unit 82.

Figure 19:
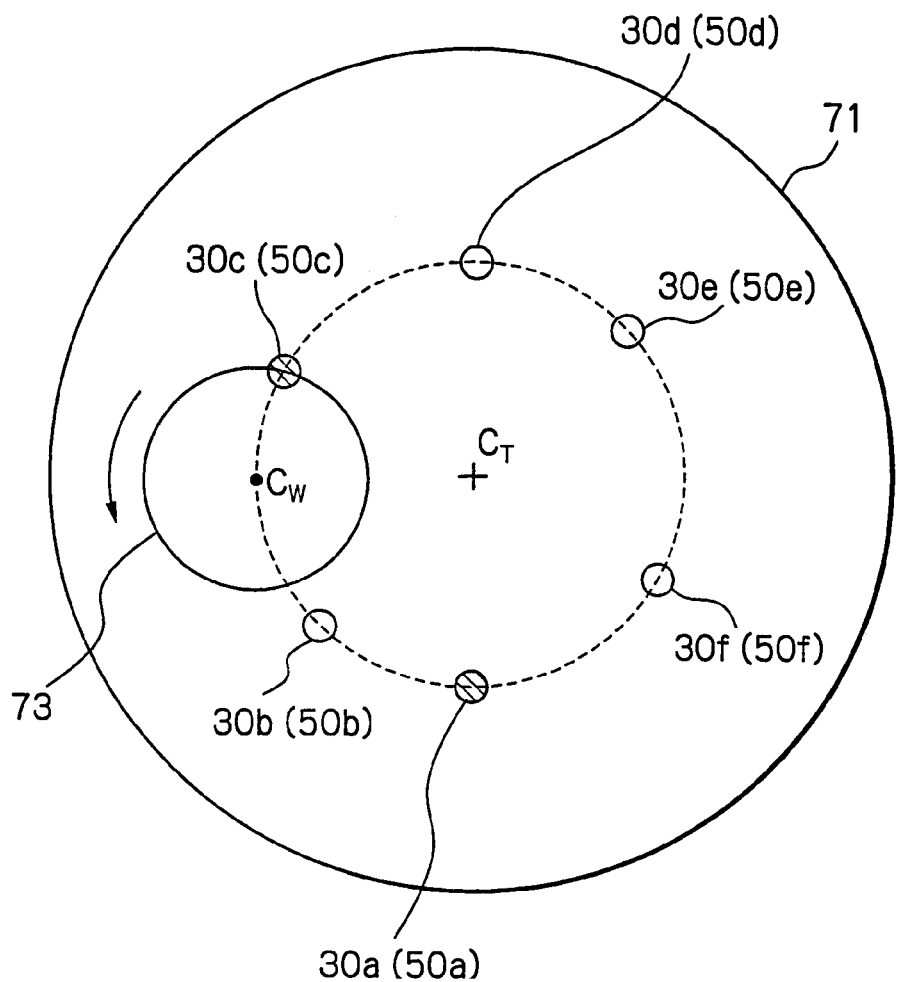
FIG. 19 is a top plan view of a turn table of the polishing apparatus illustrated in FIG. 18.

FIG. 19 is a top plan view of the polishing apparatus illustrated in FIG. 18. As illustrated in FIG. 19, six eddy current sensors 30a–30f (50a–50f) are embedded at positions which pass the center Cw of the semiconductor wafer 73 held by the top ring 72 for the polishing. Symbol CT indicates the center of rotation of the turn table 71. The eddy current sensors 30a–30f(50a–50f) are configured to sequentially detect the thickness of a conductive film such as a Cu layer, a barrier layer or the like on the semiconductor wafer 73 on the trajectory while they are passing below the semiconductor wafer 73. In this event, the eddy current sensors may use a plurality of different frequencies for detecting the thickness. In this way, the detection can be managed such that a change in the thickness of a barrier layer is mainly detected at higher frequencies, while a change in the thickness of a conductive layer is mainly detected at lower frequencies.

While the eddy current sensors are embedded at six locations in the example illustrated in FIG. 19, the number of eddy current sensors may be changed as appropriate. Also, while the foregoing embodiment has been described for a polishing apparatus which has an abrasive cloth 74 adhered on the turn table 71, a fixed abrasive grain plate may be used instead. In this case, the eddy current sensors may be disposed within the fixed abrasive grain plate. In addition, a polishing apparatus may have a plurality of turn tables 71 instead of one. Alternatively, the turn table 71 may be replaced with a belt or a web which has an abrasive surface.

In the polishing apparatus configured as described above, the semiconductor wafer 73 is held on the bottom of the top ring 72 and pressed against the abrasive cloth 74 on the top of the turn table 71 by the elevating cylinder. By supplying the polishing solution Q from the polishing solution nozzle 79, the polishing solution Q is retained on the abrasive cloth 74, so that the semiconductor wafer 73 is polished with the polishing solution Q intervening between a polished surface (lower side) of the semiconductor wafer 73 and the abrasive cloth 74.

During the polishing, the eddy current sensors 30a–30f (50a–50f) pass immediately beneath the polished surface of the semiconductor wafer 73, respectively, each time the turn table 71 makes one rotation. In this event, since the eddy current sensors 30a–30f(50a–50f) are positioned on the trajectory which passes the center Cw of the semiconductor wafer 73, the thickness of the semiconductor wafer 73 can be sequentially detected on the arcuate trajectory of the polished surface of the semiconductor wafer 73 as the sensors are moved. In this event, since the eddy current sensors 30a–30f (50a–50f) are mounted at six locations, the advancement of polishing can be detected by any of the sensors at short intervals, though intermittently In the end point detecting method using the conventional eddy current sensor illustrated in FIG. 6, since the eddy current sensor coil 129 is disposed within the top ring 123, this method is disadvantageous in that the thickness of a conductive film such as a Cu layer formed on a semiconductor wafer 124 can be measured only beneath the eddy current sensor. In this event, when an increased number of sensors are embedded in the top ring, the thickness can be measured at the increased number of locations. However, even with the provision of more eddy current sensors, this method can only provide intermittently measured values at a plurality of mutually discrete points (or a large number of points) but is incapable of providing measured values as a continuous profile. In addition, the increased number of sensors disadvantageously requires an increased manufacturing cost and complicated signal processing. To the contrary, in the polishing apparatus according to the present invention in which the eddy current sensor 30 or 50 is embedded in the turn table 71, the eddy current sensor passes beneath the polished surface of the semiconductor substrate 73 while the turn table 71 makes one rotation. In this event, since the eddy current sensor 30 or 50 is positioned on the trajectory passed by the center of the semiconductor substrate 73, the thickness of the semiconductor substrate 73 can be sequentially detected on the arcuate trajectory on the polished surface of the semiconductor substrate 73 as the sensors are moved.

Figure 20A:
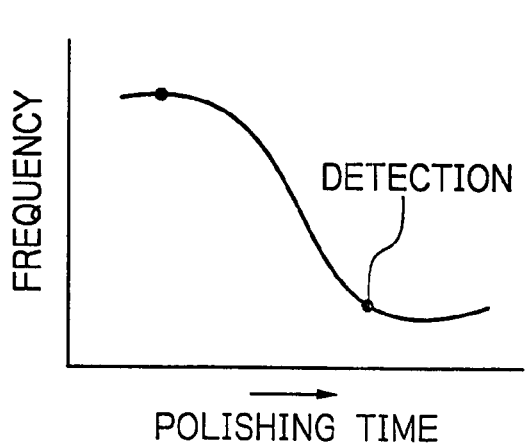
FIGS. 20*a* and 20*b* are graphs showing exemplary results of detected oscillating signals in the polishing apparatus illustrated in FIG. 18.
Figure 20B:
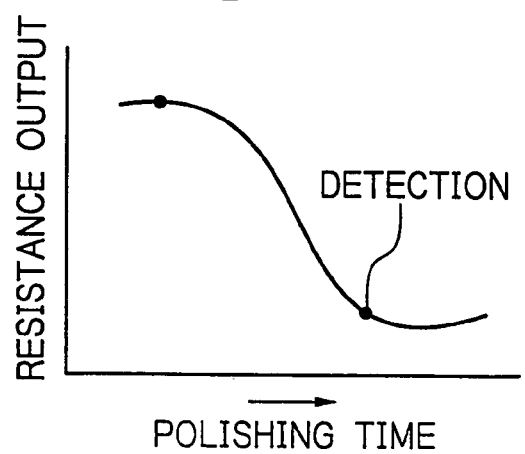

As shown in FIGS. 20a, 20b, values of signals from the eddy current sensor 30 or 50, processed by the controller 80, gradually decrease as the polishing is advanced. Stated another way, as the thickness of a conductive film is reduced, a detected value obtained by processing, by the controller 80, the signals from the eddy current sensor 30 or 50 becomes smaller. Therefore, an end point for a CMP process can be detected by monitoring the detected value output from the controller 12 with previous knowledge of the detected value which would be outputted when the conductive film is removed except for wires.

Figure 21:
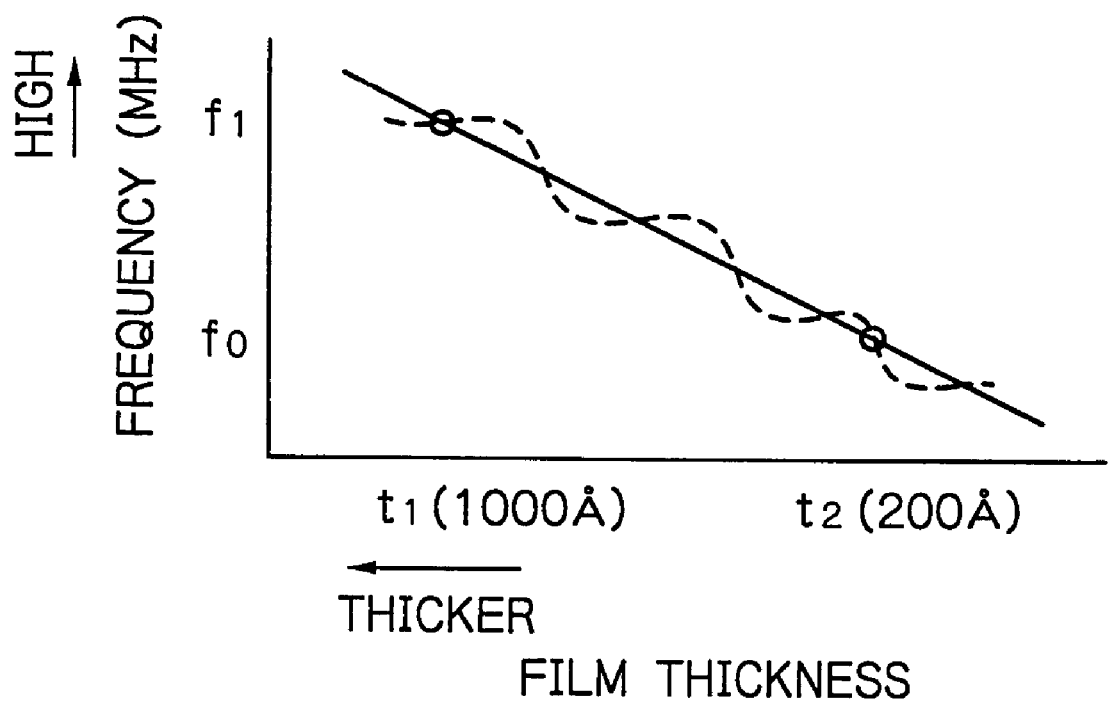
FIG. 21 is a graph showing an exemplary calibration for the oscillating frequency of the eddy current sensor and the thickness.

FIG. 21 shows an example of a calibrated relationship between the thickness of the polished semiconductor wafer 73 and oscillating frequency. Assume, for example, that a reference wafer having a thickness of 1000 Å (t1) or 200 Å (t$_2$) is prepared, and a frequency such as an oscillating frequency $f_1$ or $f_0$ in the reference wafer is measured and defined as a reference point. Then, data corresponding to a change in thickness is obtained for a change in frequency associated with the advancement of actual polishing. Such data is indicated by a dotted line. This approach can be applied as well to a detection of a resistance component output. A curve is drawn for the obtained data with respect to the reference point by an appropriate approach such as a least square method or the like. A change in thickness can be directly read from a change in the detected output when the characteristics of the eddy current sensor have been previously calibrated by such an approach.

The polishing apparatus comprising a number of such eddy current sensors can detect a polishing end point over the entirety of a semiconductor wafer, and moreover at short time intervals. In addition, since the polishing apparatus can detect an end point of the polishing of a barrier layer such as Ta, TaN, TiN layers as described above, a highly accurate detection can be accomplished for the polishing end point.

Figure 22A:
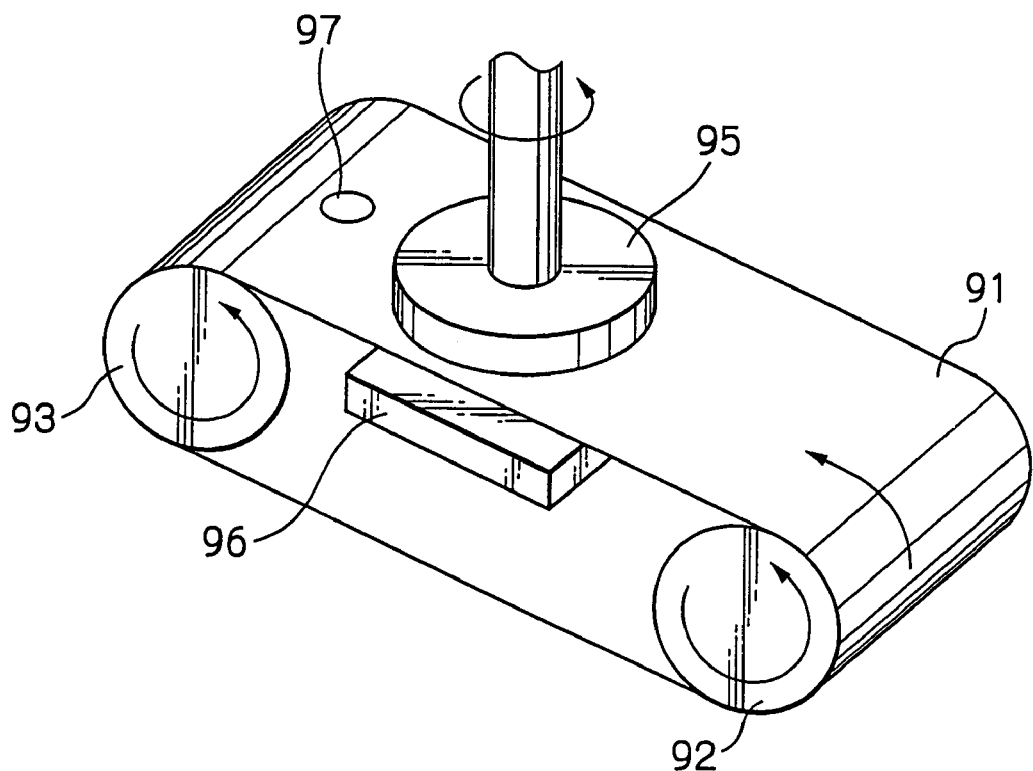
FIGS. 22*a* and 22*b* are perspective views illustrating structural examples of another polishing apparatus according to the present invention.
Figure 22B:
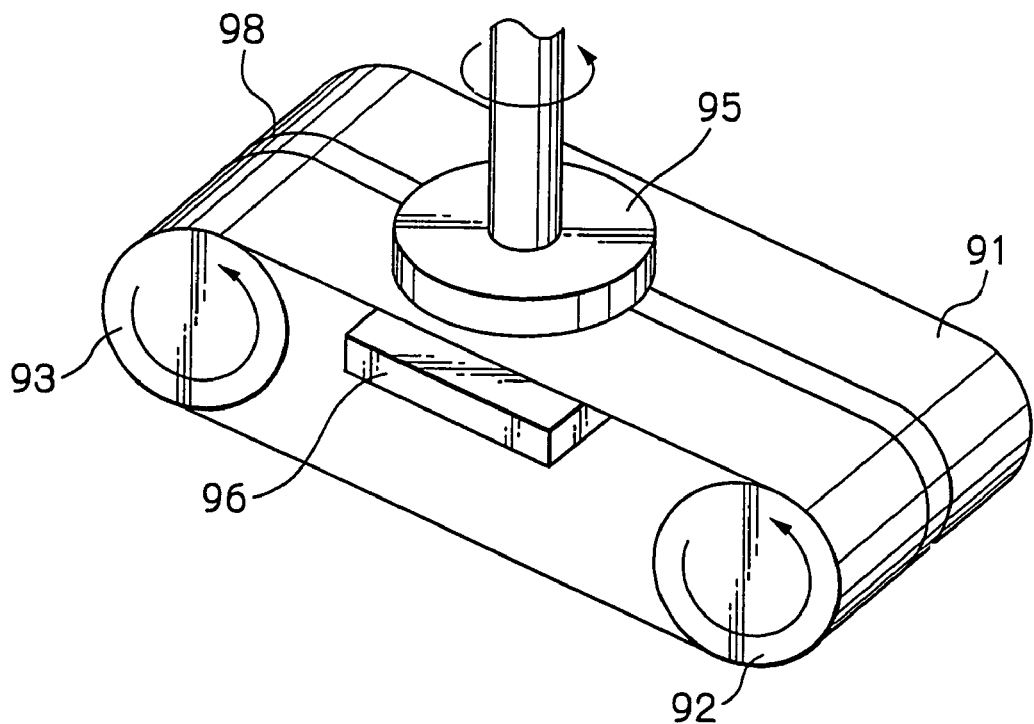

Alternatively, the removal of a conductive film except for wires may be detected by processing signals from eddy current sensors and an optical sensor and monitoring the processed signals to determine an end point for a CMP process. FIGS. 22a, 22b illustrate exemplary configurations of such a polishing apparatus. A belt-like polishing pad 91 is driven by rollers 92, 93 to rotate, so that a polished material (semiconductor wafer) held by a top ring (holder) 95 is pressed onto the polishing pad 91 as it is rotated. As a polished surface of the material under polishing is in sliding contact with the polishing pad 91 (polishing surface), the polishing is advanced accordingly. A supporter 96 mounted with the eddy current sensor and optical sensor is disposed beneath the top ring for monitoring a surface state of the polished surface. A hole 97 (FIG. 22a) and a groove 98 (FIG. 22b) are provided for the optical sensor to observe the surface state of the polished surface.

While the foregoing embodiment has been described for a Cu layer and a Ta layer as conductive films, the present invention can of course be applied to any other conductive film made of a metal such as Cr, W, Ti, and the like. In addition, the performance of the polishing apparatus for detecting a polishing end point can be improved by using (1)

an eddy current sensor signal, (2) a current signal of the turn table motor or the top ring motor, (3) an optical signal of an optical means disposed in the turn table or out of the turn table, incident to or reflected from the polished surface, and (4) a signal indicative of the temperature on the polished surface, alone or in any appropriate combination.

As described above, according to the present invention, an end point of the polishing operation can be stably and accurately detected in a polishing apparatus.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An apparatus for polishing a first film and a second film formed on a substrate, said apparatus comprising an eddy current sensor for measuring the thickness of the first and second films, said eddy current sensor comprising:
   a sensor coil for detecting an impedance of an equivalent circuit which includes said sensor coil and the substrate;
   a signal source for supplying said sensor coil with first AC signals having first frequencies for measuring a thickness of the first film and second AC signals having second frequencies for measuring a thickness of the second film;
   a phase shifter circuit for generating an in-phase component and a quadrature component from a signal detected by said sensor coil;
   a cosine synchronous detector for extracting a resistance component from a signal generated by said phase shifter;
   a sine synchronous detector for extracting a reactance component from a signal generated by said phase shifter; and
   a signal detector circuit for detecting a thickness of at least one of the first film and the second film by measuring changes of the resistance component extracted by said cosine synchronous detector and the reactance component extracted by said sine synchronous detector.

2. An apparatus according to claim 1 further comprising at least one vector calculating circuit for calculating an amplitude of the resistance component and the reactance component.

3. An apparatus according to claim 1 further comprising at least one vector calculating circuit for calculating a phase of the resistance component and the reactance component.

4. An apparatus according to claim 1 wherein the first film is a conductive film.

5. An apparatus according to claim 1 wherein the second film is a barrier film.

6. An apparatus according to claim 1 wherein the second frequencies are lower than the first frequencies.

* * * * *